US011315651B1

(12) United States Patent
Jung et al.

(10) Patent No.: US 11,315,651 B1
(45) Date of Patent: Apr. 26, 2022

(54) NON-VOLATILE MEMORY DEVICE

(71) Applicant: SAMSUNG ELECTRONICS CO., LTD., Suwon-si (KR)

(72) Inventors: Bongkil Jung, Seoul (KR); Dongjin Shin, Hwaseong-si (KR); Manjae Yang, Hwaseong-si (KR); Byungsun Lee, Suwon-si (KR); Dongsu Jang, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/355,825

(22) Filed: Jun. 23, 2021

(30) Foreign Application Priority Data

Oct. 14, 2020 (KR) .......................... 10-2020-0132576

(51) Int. Cl.
*G11C 27/00* (2006.01)
*G11C 5/14* (2006.01)
*G11C 7/10* (2006.01)

(52) U.S. Cl.
CPC ............ *G11C 27/005* (2013.01); *G11C 5/147* (2013.01); *G11C 7/1063* (2013.01); *G11C 7/1069* (2013.01); *G11C 7/1096* (2013.01)

(58) Field of Classification Search
CPC ..... G11C 27/005; G11C 5/147; G11C 7/1063; G11C 7/1069; G11C 7/1096
See application file for complete search history.

(56) References Cited

U.S. PATENT DOCUMENTS

| 6,496,438 | B2 | 12/2002 | Saito |
| 6,842,382 | B2 | 1/2005 | Kim et al. |
| 6,996,023 | B2 | 2/2006 | Kim |
| 7,102,936 | B2 | 9/2006 | Kim et al. |
| 8,194,456 | B2 * | 6/2012 | Kim ...................... G11C 5/145 365/185.18 |
| 8,885,436 | B2 | 11/2014 | Kim et al. |
| 9,053,771 | B2 | 6/2015 | Yokou |
| 10,170,176 | B2 * | 1/2019 | Ok ....................... G11C 11/4074 |
| 10,438,668 | B2 * | 10/2019 | Okamoto ............... G11C 16/30 |
| 10,565,405 | B2 | 2/2020 | Cho et al. |
| 10,599,170 | B2 * | 3/2020 | Jeong ......................... G05F 1/10 |
| 10,790,266 | B2 * | 9/2020 | Ito ............................. G11C 5/14 |

(Continued)

FOREIGN PATENT DOCUMENTS

| KR | 10-0230372 | 11/1999 |
| KR | 10-0437463 | 6/2004 |
| KR | 1020090010777 | 1/2009 |

*Primary Examiner* — Tri M Hoang
(74) *Attorney, Agent, or Firm* — F. Chau & Associates, LLC

(57) ABSTRACT

A non-volatile memory device includes a first and a second memory regions including first and second memory cells and first and second analog circuits, respectively; a control logic circuit determining on/off states of the analog circuits, and converting an external power supply voltage into an internal operating voltage for operation of each of the memory cells; and input/output circuit selecting an input/output memory region for performing input/output of data using the internal operating voltage, wherein input/output of data for the first and second memory cells are sequentially performed, and at least one of the each of the first and second analog circuits are turned on together while the input/output of data for the first memory cells is performed.

20 Claims, 25 Drawing Sheets

(56) References Cited

U.S. PATENT DOCUMENTS

2004/0013024 A1    1/2004  Park
2015/0364204 A1   12/2015  Kim et al.
2017/0372759 A1*  12/2017  Kim ......................... G11C 8/18
2020/0111513 A1*   4/2020  Baek ................... G11C 11/5621
2020/0321059 A1*  10/2020  Park ....................... G11C 16/26

* cited by examiner

NON-VOLATILE MEMORY DEVICE

CROSS-REFERENCE TO RELATED APPLICATION(S)

This U.S. non-provisional patent application claims benefit of priority under 35 U.S.C. 119(a) to Korean Patent Application No. 10-2020-0132576 filed on Oct. 14, 2020 in the Korean Intellectual Property Office, the disclosure of which is incorporated by reference in its entirety herein.

TECHNICAL FIELD

The present inventive concept relates to a non-volatile memory device.

DISCUSSION OF RELATED ART

A non-volatile memory device such as a flash memory device may operate using an external power supply. The non-volatile memory device may convert the external power supply voltage into an internal operating voltage using an internal voltage control (IVC) driver. The non-volatile memory device may be divided into a plurality of memory array tiles (MATs), and each MAT may be associated with one of a plurality of IVC drivers. Existing non-volatile memory devices turn on the IVC drivers for all the MATs, regardless of the MATs that actually operate. Recently, non-volatile memory devices have been designed to have an increased input/output speed of data as well as an improved degree of integration to process a large amount of data in a short time. Accordingly, the number of IVC drivers required for an operation of a MAT increases, and unnecessary current consumption occurs at the same time.

SUMMARY

At least one exemplary embodiment of the present inventive concept provides a non-volatile memory device that selectively turn on an IVC driver according to an address counted during an input/output operation of data. The non-volatile memory device may operate using a reduced an amount of current during input/output of data and have an improved performance.

According to an exemplary embodiment of the present inventive concept, a non-volatile memory device includes a first memory region including a plurality of first memory cells and a plurality of first analog circuits; a second memory region including a plurality of second memory cells and a plurality of second analog circuits; a control logic circuit determining whether to turn on or off the plurality of first analog circuits and the plurality of second analog circuits, based on an external signal applied from an external memory controller, and converting an external power supply voltage into an internal operating voltage for operation of each of the plurality of first memory cells and the plurality of second memory cells according to whether each of the plurality of first analog circuits and the plurality of second analog circuits are turned on or off; and an input/output circuit selecting input/output memory region for performing input/output of data using the internal operating voltage. Input/output of data for the plurality of first memory cells and input/output of data for the plurality of second memory cells are sequentially performed, and at least one of the plurality of second analog circuits is turned on together with at least one of the plurality of first analog circuits while the input/output of data for the plurality of first memory cells is performed.

According to an exemplary embodiment of the present inventive concept, a non-volatile memory device includes a semiconductor substrate; a first memory region disposed on the semiconductor substrate in a first direction, perpendicular to an upper surface of the semiconductor substrate; a second memory region disposed to be adjacent to the first memory region in a second direction, parallel to the upper surface of the semiconductor substrate; a third memory region disposed to be adjacent to the first memory region in a third direction, parallel to the upper surface of the semiconductor substrate and perpendicular to the second direction; a fourth memory region disposed to be adjacent to the second memory region in the third direction and adjacent to the third memory region in the second direction; and a pad region disposed on lateral surfaces of the first and second memory regions and transferring an external power supply voltage applied through a power pad, to a plurality of analog circuits for converting to the external power supply voltage to an internal operating voltage. The plurality of analog circuits are selectively turned on according to a memory region in which input/output of data is performed. When the plurality of analog circuits included in the third memory region or the fourth memory region are turned on, the plurality of analog circuits included in at least one of the first memory region or the second memory region are turned on together.

According to an exemplary embodiment of the present inventive concept, a non-volatile memory device includes a memory cell array, a plurality of analog circuits, an address decoder, and a control logic circuit. The memory cell array includes a plurality of memory regions respectively having a plurality of memory cells. The plurality of analog circuits are respectively disposed to be adjacent to the plurality of memory regions, and are for converting an external power supply voltage into an internal operating voltage. The address decoder outputs an address for determining an input/output memory region including a plurality of input/output memory cells in which data is input/output, among the plurality of memory cells. The control logic circuit selects only a portion of the plurality of memory regions, as a selected memory region, based on the address, and selectively turns on at least one of the plurality of analog circuits corresponding to the selected memory region. The selected memory region includes the input/output memory region, and a preliminary input/output memory region in which input/output of data is performed after data for the input/output memory region is input/output.

BRIEF DESCRIPTION OF DRAWINGS

The present inventive concept will be more clearly understood from the following detailed description, taken in conjunction with the accompanying drawings, in which.

DETAILED DESCRIPTION OF THE EXEMPLARY EMBODIMENTS

Hereinafter, exemplary embodiments of the present inventive concept will be described with reference to the accompanying drawings.

Figure 1:
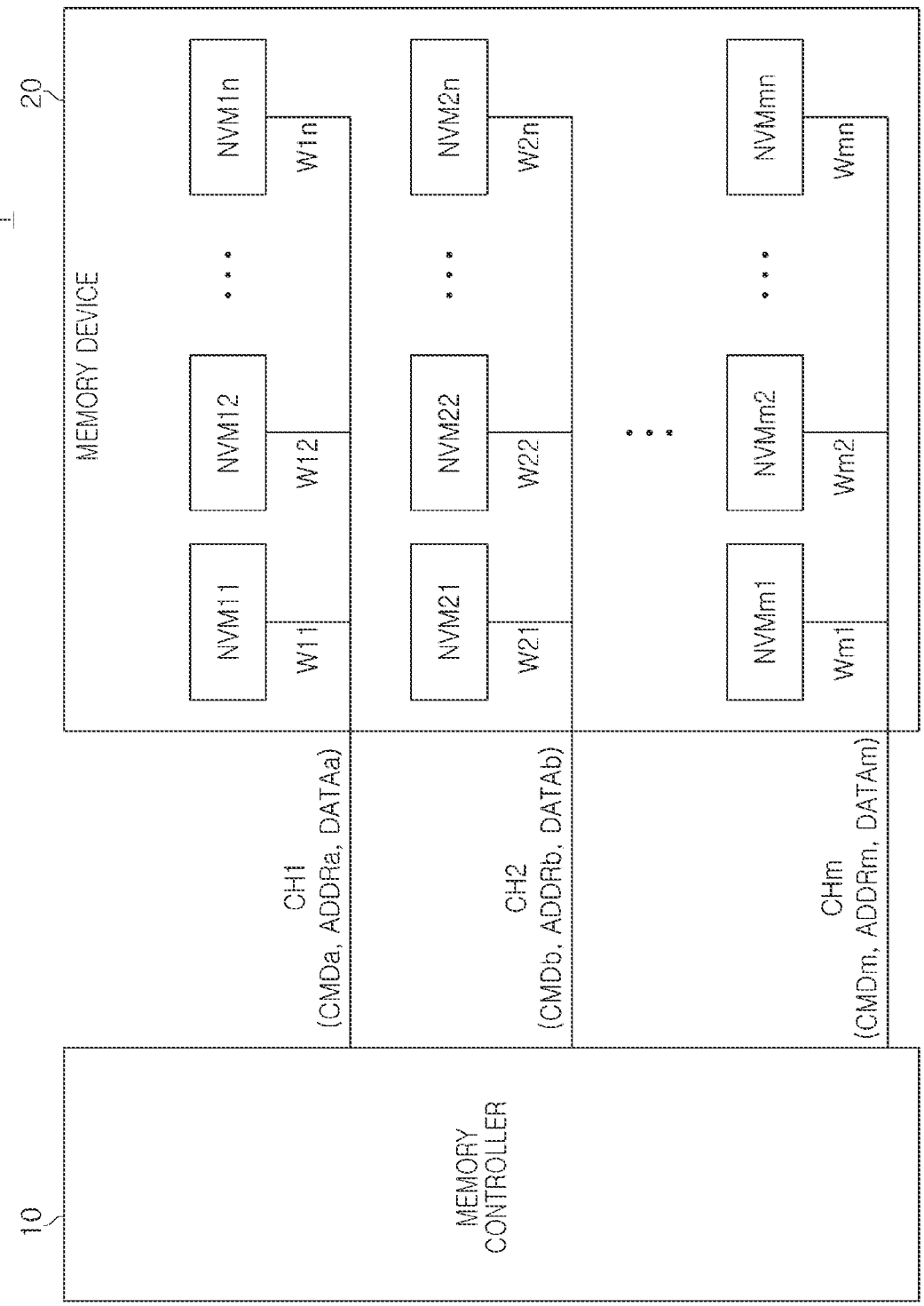
FIG. 1 is a block diagram illustrating a memory system including a memory device according to an exemplary embodiment of the present inventive concept.

FIG. 1 is a block diagram illustrating a memory system including a memory device according to an embodiment of the present inventive concept.

Referring to FIG. 1, a memory system 1 includes a memory controller 10 (e.g., a control circuit) and a memory device 20. The memory system 1 may support a plurality of channels CH1 to CHm, and the memory controller 10 and the memory device 20 may be connected through the plurality of channels CH1 to CHm. For example, the memory system 1 may be implemented as a storage device such as a solid state drive (SSD).

The memory controller 10 may transmit and receive signals to and from the memory device 20 through the plurality of channels CH1 to CHm. For example, the memory controller 10 may transmit commands CMDa to CMDm, addresses ADDRa to ADDRm, and data DATAa to DATAm to the memory device 20 through the channels CH1 to CHm, or may receive the data DATAa to DATAm from the memory device 20.

The memory device 20 may include a plurality of non-volatile memory devices NVM11 to NVMmn. Each of the non-volatile memory devices NVM11 to NVMmn may be connected to one of the plurality of channels CH1 to CHm through a way corresponding thereto. For example, the non-volatile memory devices NVM11 to NVM1n may be connected to the first channel CH1 through ways W11 to W1n, and the non-volatile memory devices NVM21 to NVM2n may be connected to the second channel CH2 through ways W21 to W2n. In an embodiment, each of the non-volatile memory devices NVM11 to NVMmn may be implemented in an arbitrary memory unit capable of operating according to an individual command from the memory controller 10. For example, each of the non-volatile memory devices NVM11 to NVMmn may be implemented as a chip or a die, but the present inventive concept is not limited thereto.

The memory controller 10 may select one of the non-volatile memory devices connected to a target channel through each of the channels, and may transmit and receive signals to and from the selected non-volatile memory device. For example, the memory controller 10 may select a non-volatile memory device NVM11 connected to a first channel CH1, among the non-volatile memory devices NVM11 to NVMmn. The memory controller 10 may transmit a command CMDa, an address ADDRa, and data DATAa to the selected non-volatile memory device NVM11 through the first channel CH1, or may receive the data DATAa from the selected non-volatile memory device NVM11.

The memory controller 10 may transmit and receive signals to and from the memory device 20 through different channels in parallel. For example, the memory controller 10 may transmit a command CMDb to the memory device 20 through a second channel CH2 while transmitting the command CMDa to the memory device 20 through the first channel CH1. For example, the memory controller 10 may receive data DATAb from the memory device 20 through the second channel CH2 while receiving the data DATAa from the memory device 20 through the first channel CH1.

The memory controller 10 may control an overall operation of the memory device 20. The memory controller 10 may transmit signals to the channels CH1 to CHm, to control each of the non-volatile memory devices NVM11 to NVMmn connected to the channels CH1 to CHm. For example, the memory controller 10 may transmit the command CMDa and the address ADDRa through the first channel CH1, to control a selected one of the non-volatile memory devices NVM11 to NVMmn.

Each of the non-volatile memory devices NVM11 to NVMmn may operate under control of the memory controller 10. For example, the non-volatile memory device NVM11 may program the data DATAa according to the command CMDa and the address ADDRa, provided through the first channel CH1. For example, a non-volatile memory device NVM21 may read the data DATAb according to the command CMDb and the address ADDRb, provided through the second channel CH2, and may transmit the read data DATAb to the memory controller 10.

FIG. 1 illustrates that the memory device 20 communicates with the memory controller 10 through m channels, and the memory device 20 may include n non-volatile memory devices corresponding to each of the channels. The number of channels and the number of non-volatile memory devices connected to one (1) channel among the channels may be variously changed.

Figure 2:
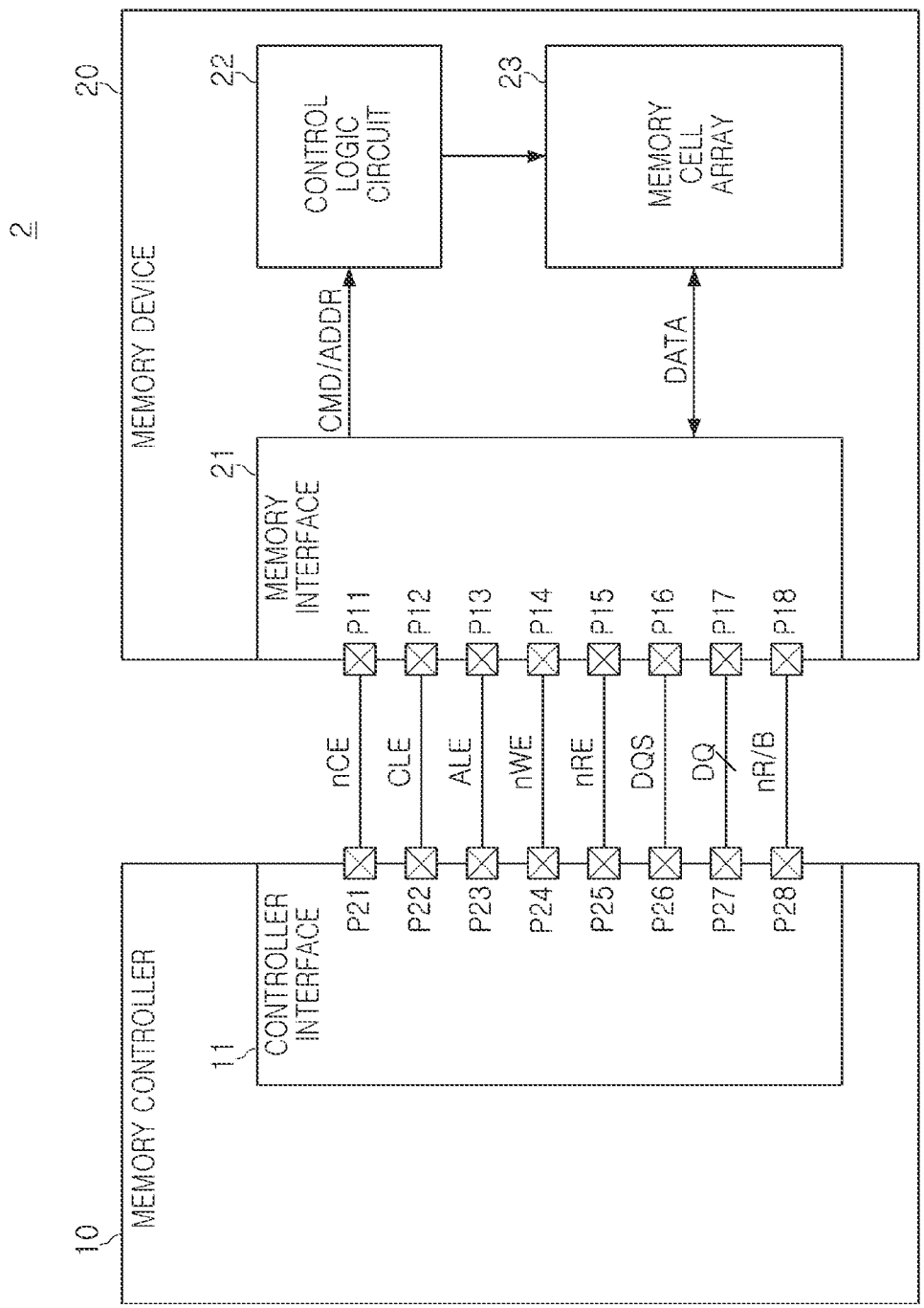
FIG. 2 is a block diagram illustrating a memory system including a memory device according to an exemplary embodiment of the present inventive concept.

FIG. 2 is a block diagram illustrating a memory system including a memory device according to an exemplary embodiment of the present inventive concept.

Referring to FIG. 2, a memory system 2 includes a memory device 20 and a memory controller 10. The memory device 20 may correspond to one of the non-volatile memory devices NVM11 to NVMmn of FIG. 1 communicating with the memory controller 10, based on one of the plurality of channels CH1 to CHm of FIG. 1. The memory controller 10 may correspond to the memory controller 10 of FIG. 1.

The memory device 20 may include first to eighth pins P11 to P18, a memory interface circuit 21, a control logic circuit 22, and a memory cell array 23.

The memory interface circuit 21 may receive a chip enable signal nCE from the memory controller 10 through the first pin P11. The memory interface circuit 21 may transmit and receive signals to and from the memory controller 10 through the second to eighth pins P12 to P18 according to the chip enable signal nCE. For example, when the chip enable signal nCE is in an enable state (e.g., a low level), the memory interface circuit 21 transmits and receives signals to and from the memory controller 10 through the second to eighth pins P12 to P18.

The memory interface circuit 21 may receive a command latch enable signal CLE, an address latch enable signal ALE, and a write enable signal nWE from the memory controller 10 through the second to fourth pins P12 to P14, respectively. The memory interface circuit 21 may receive a data signal DQ from the memory controller 10 through the seventh pin P17 or transmit the data signal DQ to the memory controller 10. A command CMD, an address ADDR, and data DATA may be transmitted via the data signal DQ. For example, the data signal DQ may be transmitted through a plurality of data signal lines. In this case, the seventh pin P17 may include a plurality of pins respectively corresponding to a plurality of data signals DQ.

The memory interface circuit 21 may obtain the command CMD from the data signal DQ, received during an enable section (e.g., a high-level state) of the command latch enable signal CLE based on toggle time points of the write enable signal nWE. The memory interface circuit 21 may obtain the address ADDR from the data signal DQ, received during an enable section (e.g., a high-level state) of the address latch enable signal ALE based on the toggle time points of the write enable signal nWE.

In an embodiment, the write enable signal nWE is maintained at a static state (e.g., a high level or a low level) and then toggles between the high level and the low level. For example, the write enable signal nWE may toggle in a section in which the command CMD or the address ADDR is transmitted. Thus, the memory interface circuit 21 may obtain the command CMD or the address ADDR based on toggle time points of the write enable signal nWE.

The memory interface circuit 21 may receive a read enable signal nRE from the memory controller 10 through the fifth pin P15. The memory interface circuit 21 may receive a data strobe signal DQS from the memory controller 10 through the sixth pin P16 or transmit the data strobe signal DQS to the memory controller 10.

In a data (DATA) output operation of the memory device 20, the memory interface circuit 21 may receive the read enable signal nRE, toggling through the fifth pin P15, before outputting the data DATA. The memory interface circuit 21 may generate the data strobe signal DQS, toggling based on the toggling of the read enable signal nRE. For example, the memory interface circuit 21 may generate a data strobe signal DQS, which starts toggling after a predetermined delay (e.g., tDQSRE), based on a toggling start time of the read enable signal nRE. The memory interface circuit 21 may transmit the data signal DQ including the data DATA based on a toggle time point of the data strobe signal DQS. Thus, the data DATA may be aligned with the toggle time point of the data strobe signal DQS and transmitted to the memory controller 10.

In a data (DATA) input operation of the memory device 20, when the data signal DQ including the data DATA is received from the memory controller 10, the memory interface circuit 21 may receive the data strobe signal DQS, toggling, along with the data DATA from the memory controller 10. The memory interface circuit 21 may obtain the data DATA from the data signal DQ based on toggle time points of the data strobe signal DQS. For example, the memory interface circuit 21 may sample the data signal DQ at rising and falling edges of the data strobe signal DQS and obtain the data DATA.

The memory interface circuit 21 may transmit a ready/busy output signal nR/B to the memory controller 10 through the eighth pin P18. The memory interface circuit 21 may transmit state information of the memory device 20 through the ready/busy output signal nR/B to the memory controller 10. When the memory device 20 is in a busy state (i.e., when operations are being performed in the memory device 20), the memory interface circuit 21 may transmit a ready/busy output signal nR/B indicating the busy state to the memory controller 10. When the memory device 20 is in a ready state (i.e., when operations are not performed or completed in the memory device 20), the memory interface circuit 21 may transmit a ready/busy output signal nR/B indicating the ready state to the memory controller 10. For example, while the memory device 20 is reading data DATA from the memory cell array 23 in response to a page read command, the memory interface circuit 21 may transmit a ready/busy output signal nR/B indicating a busy state (e.g., a low level) to the memory controller 10. For example, while the memory device 20 is programming data DATA to the memory cell array 23 in response to a program command, the memory interface circuit 21 may transmit a ready/busy output signal nR/B indicating the busy state to the memory controller 10.

The control logic circuit 22 may control all operations of the memory device 20. The control logic circuit 22 may receive the command/address CMD/ADDR obtained from the memory interface circuit 21. The control logic circuit 22 may generate control signals for controlling other components of the memory device 20 in response to the received command/address CMD/ADDR. For example, the control logic circuit 22 may generate various control signals for programming data DATA to the memory cell array 23 or reading the data DATA from the memory cell array 23.

The memory cell array 23 may store the data DATA obtained from the memory interface circuit 21, via the control of the control logic circuit 22. The memory cell array 23 may output the stored data DATA to the memory interface circuit 21 via the control of the control logic circuit 22.

The memory cell array 23 may include a plurality of memory cells. For example, the plurality of memory cells may be flash memory cells. However, the inventive concept is not limited thereto, and the memory cell may be a resistive random access memory (RRAM) cell, a ferroelectric random access memory (FRAM) cell, a phase change random access memory (PRAM) cell, a thyristor random access memory (TRAM) cell, or a magnetic random access memory (MRAM) cell. Hereinafter, an embodiment in which the memory cells are NAND flash memory cells will mainly be described.

The memory controller 10 may include first to eighth pins P21 to P28 and a controller interface circuit 11. The first to eighth pins P21 to P28 may respectively correspond to the first to eighth pins P11 to P18 of the memory device 20.

The controller interface circuit 11 may transmit the chip enable signal nCE to the memory device 20 through the first pin P21. The controller interface circuit 11 may transmit and receive signals to and from the memory device 20, selected or enabled by the chip enable signal nCE, through the second to eighth pins P22 to P28.

The controller interface circuit 11 may transmit the command latch enable signal CLE, the address latch enable signal ALE, and the write enable signal nWE to the memory device 20 through the second to fourth pins P22 to P24, respectively. The controller interface circuit 11 may transmit or receive the data signal DQ to and from the memory device 20 through the seventh pin P27.

The controller interface circuit 11 may transmit the data signal DQ including the command CMD or the address ADDR to the memory device 20 along with the write enable signal nWE, toggling. The controller interface circuit 11 may transmit the data signal DQ including the command CMD to the memory device 20 by transmitting a command latch enable signal CLE having an enable state. Also, the controller interface circuit 11 may transmit the data signal DQ including the address ADDR to the memory device 20 by transmitting an address latch enable signal ALE having an enable state.

The controller interface circuit 11 may transmit the read enable signal nRE to the memory device 20 through the fifth pin P25. The controller interface circuit 11 may receive or transmit the data strobe signal DQS from or to the memory device 20 through the sixth pin P26.

In a data (DATA) output operation of the memory device 20, the controller interface circuit 11 may generate a read enable signal nRE, toggling, and transmit the read enable signal nRE to the memory device 20. For example, before outputting data DATA, the controller interface circuit 11 may generate a read enable signal nRE, changed from a static state (e.g., a high level or a low level) to a toggling state. Thus, the memory device 20 may generate a data strobe signal DQS, toggling, based on the read enable signal nRE. The controller interface circuit 11 may receive the data signal DQ including the data DATA along with the data strobe signal DQS, toggling, from the memory device 20. The controller interface circuit 11 may obtain the data DATA from the data signal DQ based on a toggle time point of the data strobe signal DQS.

In a data (DATA) input operation of the memory device 20, the controller interface circuit 11 may generate a data strobe signal DQS, toggling. For example, before transmitting data DATA, the controller interface circuit 11 may generate a data strobe signal DQS, changed from a static state (e.g., a high level or a low level) to a toggling state. The controller interface circuit 11 may transmit the data signal DQ including the data DATA to the memory device 20 based on toggle time points of the data strobe signal DQS.

The controller interface circuit 11 may receive a ready/busy output signal nR/B from the memory device 20 through the eighth pin P28. The controller interface circuit 11 may determine state information of the memory device 20 based on the ready/busy output signal nR/B.

Figure 3:
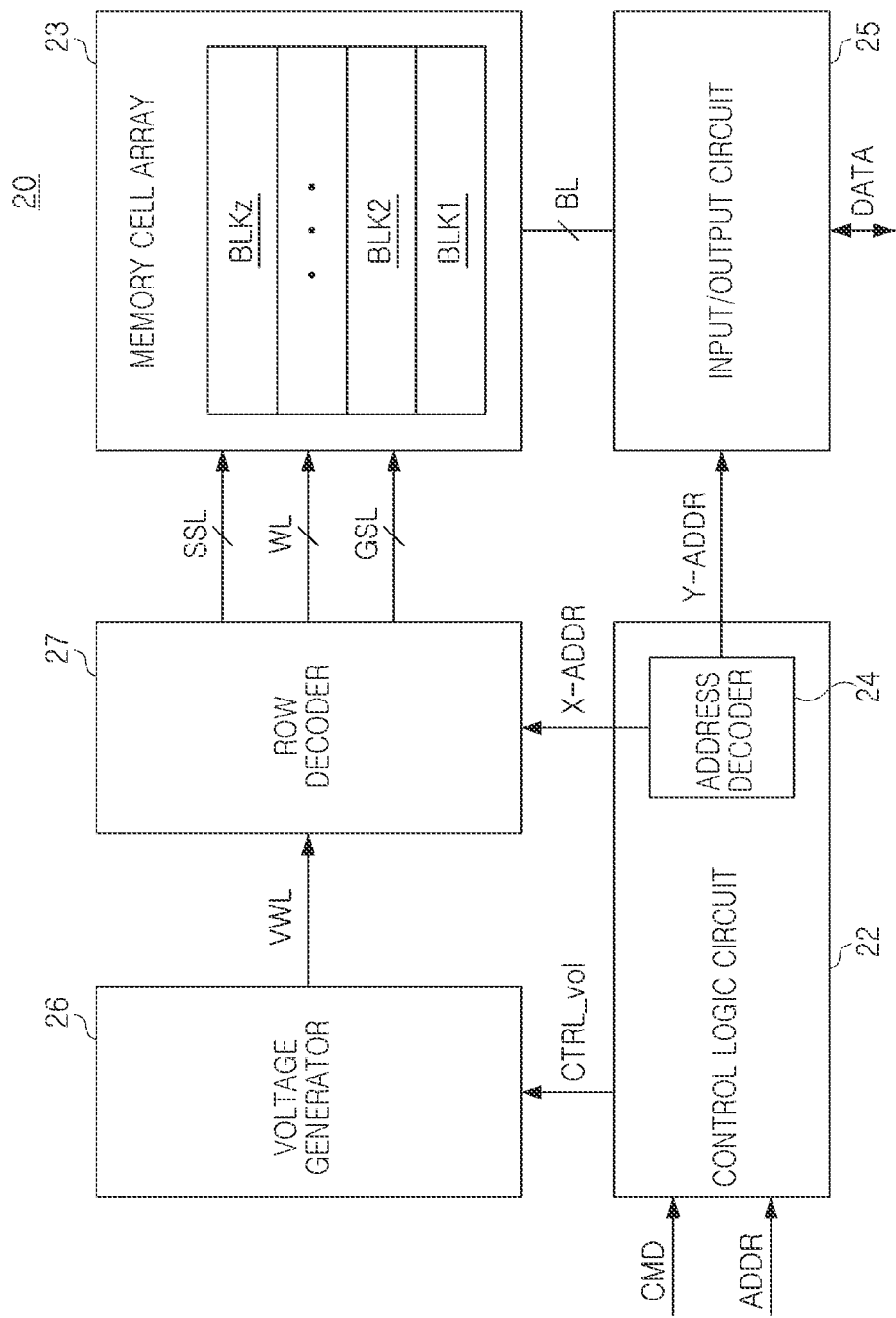
FIG. 3 is a block diagram illustrating a memory device according to an exemplary embodiment of the present inventive concept.

FIG. 3 is a block diagram illustrating a memory device according to an exemplary embodiment of the present inventive concept.

FIG. 3 is a schematic block diagram illustrating a configuration of the memory device 20 illustrated in FIG. 2. Referring to FIG. 3, a memory device 20 includes a control logic circuit 22, a memory cell array 23, input/output circuit 25, a voltage generator 26, and a row decoder 27 (e.g., a decoder circuit). The control logic circuit 22 may include an address decoder 24 (e.g., a decoder circuit). As illustrated in FIG. 2, the memory device 20 may further include a memory interface circuit 21. Further, although not illustrated in FIG. 1, the memory device 20 may further include a column logic, a pre-decoder, a temperature sensor, or a command decoder.

The control logic circuit 22 may generally control various operations in the memory device 20. The control logic circuit 22 may output various control signals in response to a command CMD and/or an address ADDR from the memory interface circuit 21. For example, the control logic circuit 22 may output a voltage control signal CTRL_vol, a row address X-ADDR, and a column address Y-ADDR. However, the present inventive concept is not limited to those illustrated therein. The address decoder 24 may have a separate configuration from the control logic circuit 22. In this case, the address decoder 24 may output the row address X-ADDR and the column address Y-ADDR. In a memory device 20 according to an embodiment of the present inventive concept, the address decoder 24 counts and outputs a column address Y-ADDR for determining a plurality of input/output memory cells to which data are input/output, among a plurality of memory cells included in a memory cell array 23. For example, input/output of data may be determined in units of a plurality of memory regions for a plurality of input/output memory cells to which data are input/output, and the address decoder 24 may sequentially count and output addresses of each of the plurality of memory regions.

In a memory device 20 according to an embodiment of the present inventive concept, the control logic circuit 22 determines whether to turn on or off each of a plurality of analog circuits generating an internal operating voltage from an external power supply voltage. For example, the plurality of analog circuits may be included in peripheral circuits adjacent to the memory cell array 23, and may include an internal voltage control (IVC) driver. A control logic circuit 22 included in the memory device 20 according to an embodiment of the present inventive concept selects a portion of a plurality of memory regions, based on an address output from the address decoder 24. The control logic circuit 22 is configured to individually turn on one or more of a plurality of analog circuits corresponding to the selected memory regions, to minimize an amount of current occurring in a data input/output operation to be consumed by the corresponding analog circuits. However, the present inventive concept is not limited to this embodiment, and a plurality of analog circuits may be turned on under various conditions. Accordingly, an amount of current to be consumed by the plurality of analog circuits occurring in a data input/output operation may vary according to each of the conditions.

The memory cell array 23 may include a plurality of memory blocks BLK1 to BLKz (where, z is a positive integer), and each of the plurality of memory blocks BLK1 to BLKz may include a plurality of memory cells. The memory cell array 23 may be connected to the input/output circuit 25 through bit lines BL, and may be connected to the row decoder 27 through word lines WL, string selection lines SSL, and ground selection lines GSL.

In an embodiment, the memory cell array 23 may include a 3D memory cell array, and the 3D memory cell array may include a plurality of memory cell strings. Each of the memory cell strings may include memory cells connected to word lines, vertically stacked on a substrate. U.S. Pat. Nos. 7,679,133, 8,553,466, 8,654,587, 8,559,235, and U.S. Patent Application Publication No. 2011/0233648 provide examples of 3D memory cell arrays and are incorporated by reference herein. In an embodiment, the memory cell array 23 may include a 2D memory cell array, and the 2D memory cell array may include a plurality of memory cell strings, arranged in row and column directions.

The input/output circuit 25 may include a plurality of page buffers, and the plurality of page buffers may be respectively connected to the memory cells through the plurality of bit lines BL. The input/output circuit 25 may select at least one bit line, among the bit lines BL, in response to the column address Y-ADDR. The input/output circuit 25 may operate as a write driver or a sense amplifier according to an operation mode. For example, during a program operation, the input/output circuit 25 may apply a bit line voltage corresponding to data to be programmed, to the selected bit line. During a read operation, the input/output circuit 25 may sense a current or a voltage of the selected bit line, to sense data stored in the memory cell. In the memory device 20 according to an exemplary embodiment of the present inventive concept, input/output circuit 25 may use an internal operating voltage converted from an external power supply voltage, to select input/output memory region for performing input/output of data. For example, the input/output circuit 25 may select a memory region into which data is input/output in response to a column address Y-ADDR.

The voltage generator 26 may generate various types of voltages for performing a program operation, a read operation, and an erase operation, based on the voltage control signal CTRL_vol. For example, the voltage generator 26 may generate a program voltage, a read voltage, a program verification voltage, or an erase voltage, as a word line voltage VWL.

In response to the row address X-ADDR, the row decoder 27 may select one of the plurality of word lines WL, and may select one of the plurality of string selection lines SSL. For example, during a program operation, the row decoder 27 may apply a program voltage and a program verification voltage to the selected word line, and may apply a read voltage to the selected word line during a read operation.

Figure 4:
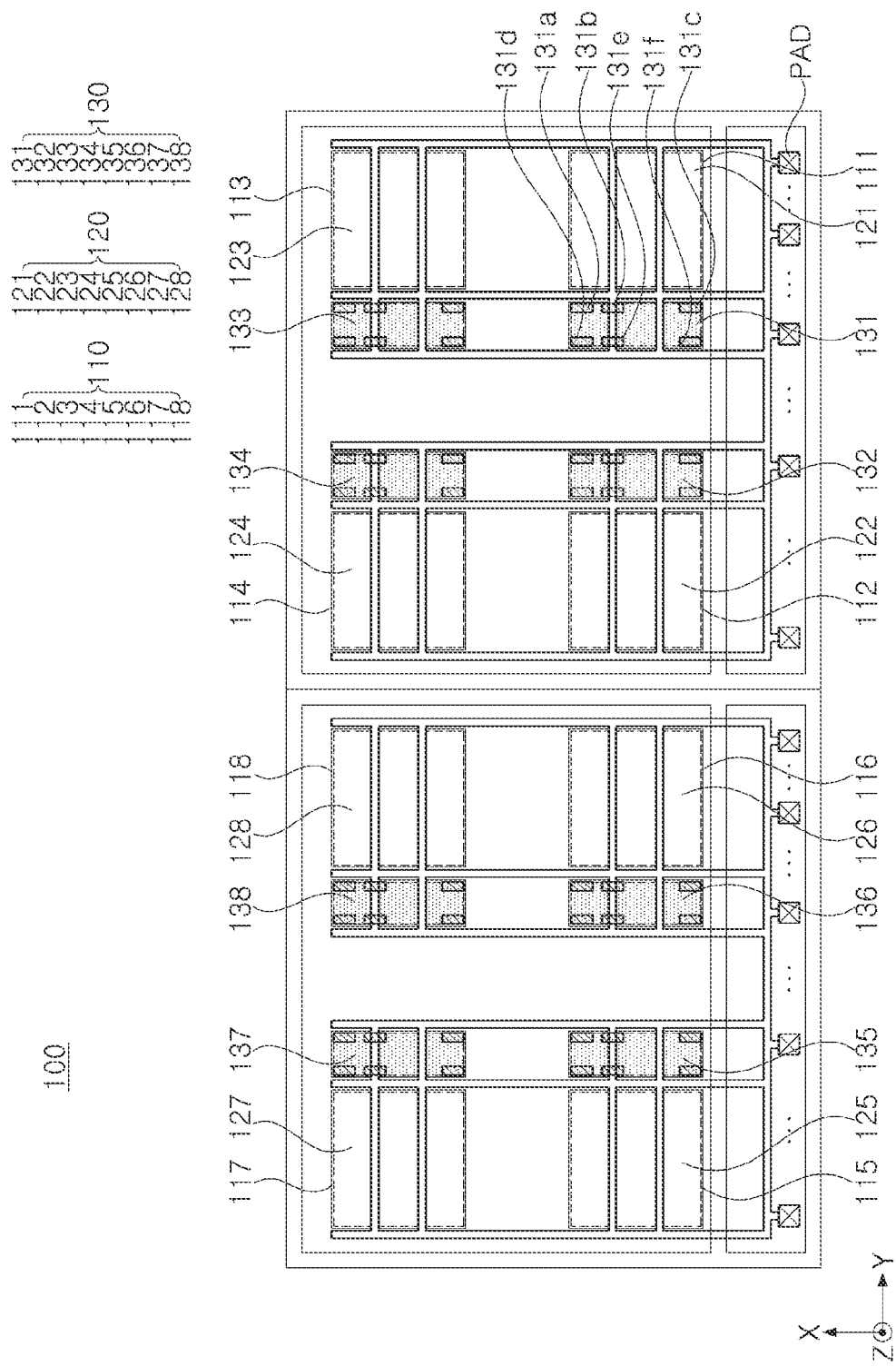
FIG. 4 is a schematic plan view illustrating a memory device according to an exemplary embodiment of the present inventive concept.
Figure 5:
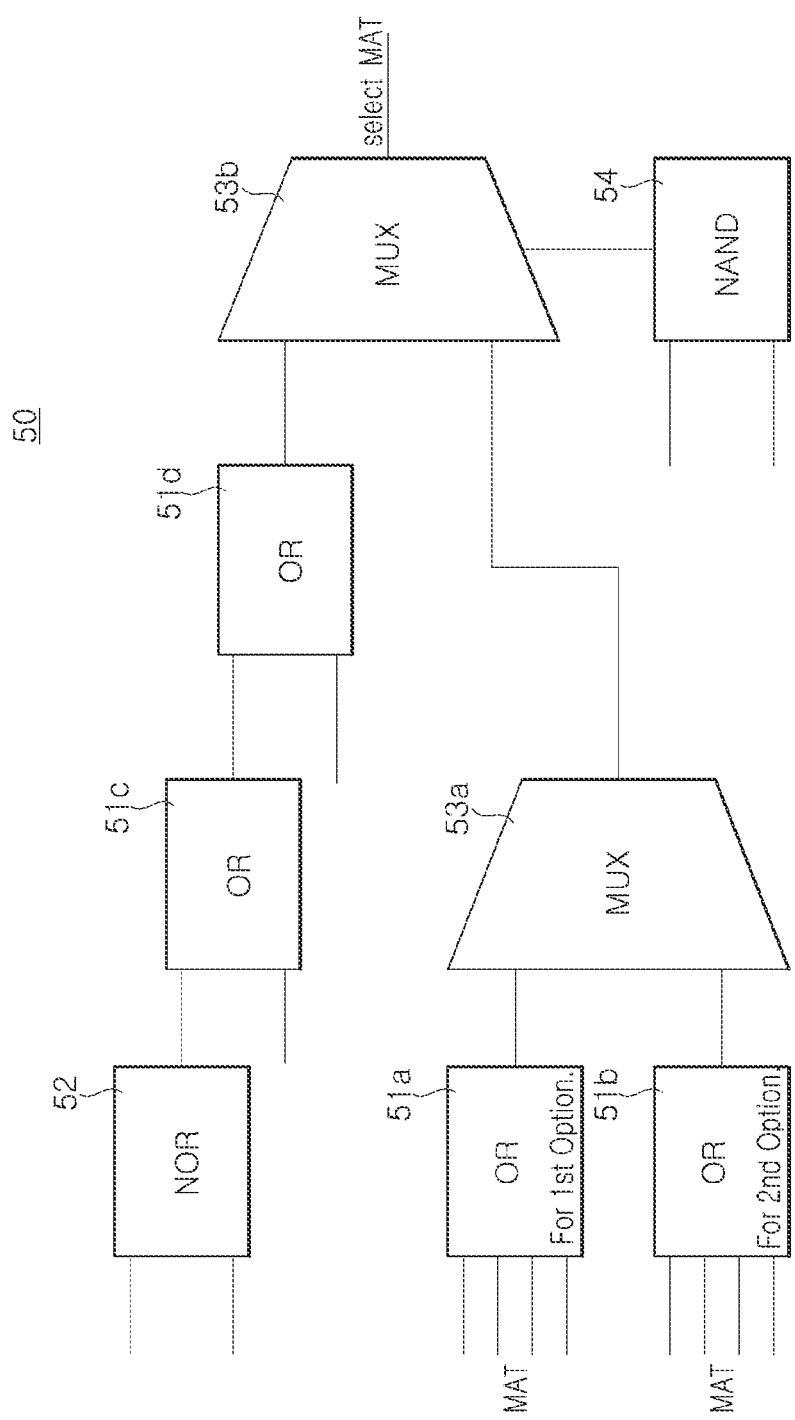
FIG. 5 is a view illustrating an IVC driver included in a memory device according to an exemplary embodiment of the present inventive concept.

FIG. 4 is a schematic plan view illustrating a memory device according to an exemplary embodiment of the present inventive concept, and FIG. 5 is a view illustrating an IVC driver included in a memory device according to an exemplary embodiment of the present inventive concept.

Referring to FIG. 4, a memory device 100 according to an embodiment of the present inventive concept includes a memory cell array including a plurality of memory regions 111, 112, . . . , and 118 (i.e., 110) having a plurality of memory cells 121, 122, . . . , and 128 (i.e., 120) and a plurality of peripheral circuits 131, 132, . . . , and 138 (i.e., 130) corresponding thereto, and a pad region PAD receiving an external power supply voltage through a power pad. For example, the plurality of memory regions 110 may be a unit for performing operations, respectively, and may be defined as a plurality of memory array tiles (MAT).

Referring to FIG. 4, a memory device 100 according to an exemplary embodiment of the present inventive concept includes a semiconductor substrate, and first to eighth memory regions (i.e., 110) disposed on the semiconductor substrate in a first direction (e.g., a Z-direction), perpendicular to an upper surface of the semiconductor substrate. For example, a second memory region 112 may be disposed to be adjacent to a first memory region 111 in a second direction (e.g., a Y-direction), parallel to the upper surface of the semiconductor substrate. For example, a third memory region 113 may be disposed to be adjacent to the first memory region 111 in a third direction (e.g., an X-direction), parallel to the upper surface of the semiconductor substrate and perpendicular to the second direction. For example, a fourth memory region 114 may be disposed to be adjacent to the second memory region 112 in the third direction, and adjacent to the third memory region 113 in the second direction. A fifth memory region 115 to an eighth memory region 118 may be disposed to be adjacent to and have a mirror shape to the first memory region 111 to the fourth memory region 114 in the second direction. For example, eight (8) memory regions 110 may be arranged in a 4×2 shape. For example, eight (8) memory regions 110 may include first to fourth memory regions 111, 112, 113, and 114 arranged in a 2×2 shape, and fifth to eighth memory regions 115, 116, 117, and 118 disposed to be adjacent to and have a mirror shape to the first to fourth memory regions 111, 112, 113, and 114.

However, this is only illustrative and embodiments of the inventive concept are not limited thereto. For example, the number of the plurality of memory regions 110 may be 4, 12, or 16, and may have other numbers. In addition, an arrangement of the plurality of memory regions 110 may also differ from the shape illustrated in FIG. 4. For example, in the memory device 100 according to the embodiment illustrated in FIG. 4, although the peripheral circuits 130 are illustrated as being disposed on lateral surfaces of the plurality of memory cells 120, the memory device 100 is not limited thereto. When a chip has a chip-on-peri (COP) structure, the peripheral circuit 130 may have a structure disposed below the plurality of memory cells 120. Hereinafter, it is assumed that a memory device 100 according to an embodiment of the present inventive concept includes a plurality of memory regions 110 having the arrangement illustrated in FIG. 4.

In a memory device 100 according to an exemplary embodiment of the present inventive concept, peripheral circuits 130 respectively corresponding to a plurality of memory regions 110 operate independently. For example, independent control signals may be respectively input to the plurality of memory regions 110. Each of the plurality of memory regions 110 receiving any one of the control signals may perform an operation according to the received control signal. An operation performed by the plurality of memory regions 110 may be one of a read operation, a program operation, and an erase operation, and the plurality of memory regions 110 may simultaneously perform different operations.

In a memory device 100 according to an exemplary embodiment of the present inventive concept, the pad region PAD is disposed on lateral surfaces of the first and second memory regions 111 and 112. The pad region PAD may also be disposed on lateral surfaces of the fifth and sixth memory regions 115 and 116 disposed in a mirror shape to the first and second memory regions 111 and 112. For example, the pad region PAD may transmit an external power supply voltage, applied through the power pad, to the peripheral circuit 130. However, a shape and configuration of the pad region PAD are not limited to those illustrated in FIG. 4.

In a memory device 100 according to an exemplary embodiment of the present inventive concept, a peripheral circuit 130 includes a plurality of analog circuits for converting an external power supply voltage into an internal operating voltage for operation of a plurality of memory regions 110. For example, a first peripheral circuit 131 included in a first memory region 111 may include a plurality of first analog circuits 131a, 131b, . . . , and 131f. For example, each of the plurality of first analog circuits 131a, 131b, . . . , and 131f may be an IVC driver. Likewise, peripheral circuits 130 included in the plurality of memory regions 110 may include a plurality of analog circuits. The plurality of analog circuits may be disposed in a space in which a first memory region 111 and a second memory region 112 are adjacent to each other, and in a space in which a third memory region 113 and a fourth memory region 114 are adjacent to each other. In addition, the plurality of analog circuits may be disposed in a space in which a fifth memory region 115 and a sixth memory region 116 are adjacent to each other, and in a space in which a seventh memory region 117 and an eighth memory region 118 are adjacent to each other. For example, the analog circuits may be disposed between the first memory region 111 and the second memory region 112, between the third memory region 113 and a fourth memory region 114, between the fifth memory region 115 and the sixth memory region 116, and between the seventh memory region 117 and the eighth memory region 118.

As illustrated in FIG. 4, a plurality of IVC drivers may be distributed and disposed with an integration degree necessary for a semiconductor chip. For example, each of the plurality of memory regions 110 may include a plurality of IVC drivers corresponding thereto. FIG. 4 illustrates that each of the plurality of memory regions 110 includes six (6) IVC drivers, but embodiments of the inventive concept are not limited thereto. For example, the number of IVC drivers included in the peripheral circuit 130 may vary as needed. For example, each of the plurality of memory regions 110 may have nine (9) IVC drivers corresponding thereto, and may have sixteen (16) IVC drivers corresponding thereto. In an exemplary embodiment, a given memory region or a MAT such as memory region 111 includes N (e.g., 6, 9, etc.) IVC drivers each corresponding to one distinct portion among a plurality of portions of the given memory region. The plurality of portions may correspond to a single MAT, and a plurality of MATs may be present. An address (e.g., ADDRa, ADDRb, etc.) received from a host or the memory controller 10 may identify a distinct one of the MATs and a distinct one of the portions within the identified MAT. The address decoder 24 may perform a mathematical calculation on the address to determine a tuple identifying the corresponding MAT and the corresponding portion. The tuple may identify a distinct one of a plurality of IVC drivers.

A NAND flash memory may convert an external power supply voltage, externally applied, into an internal operating voltage, and use the internal operating voltage as an operating power for a memory device. For example, the external power supply voltage may be about 2.5V to 3.5V, and the internal operating voltage may be about 2.0V. In a memory device 100 according to an embodiment of the present inventive concept, a control logic circuit included in a peripheral circuit 130 determines whether to turn on or off each of a plurality of analog circuits. Therefore, a plurality of analog circuits to be turned on, may convert an external power supply voltage into an internal operating voltage. However, an internal operating voltage required for operation of a memory device is not limited to one (1) value, and may vary according to the operation of the memory device. For example, the number of analog circuits turned on by a control logic circuit may be determined based on operations of the memory cells.

In a memory device 100 according to an exemplary embodiment of the present inventive concept, the analog circuit is a logic circuit 50 as illustrated in FIG. 5. Referring to FIG. 5, the analog circuit is an IVC driver including logic gates such as OR gates 51a, 51b, 51c, and 51d, a NOR gate 52, multiplexers 53a and 53b, and a NAND gate 54. Referring to FIG. 4 together, a memory device 100 according to an embodiment of the present inventive concept may include a plurality of first to eighth analog circuits respectively corresponding to first to eighth memory regions. For example, whether the plurality of first analog circuits 131a, 131b, . . . , and 131f are turned on may be determined independently from whether remaining second to eighth analog circuits are turned on. Likewise, whether each of the plurality of second to eighth analog circuits is turned on may also be determined independently from whether the remaining analog circuit(s) is turned on.

In a memory device 100 according to an exemplary embodiment of the present inventive concept, whether an analog circuit is turned on or off may be determined under various conditions. Each of the conditions may include information on whether each of the plurality of analog circuits is turned on according to a memory region in which data is accessed. For example, a control logic circuit included in the memory device 100 may select a portion of a plurality of memory regions according to one of a first condition or a second condition different from the first condition, and may turn on an IVC driver corresponding to the selected memory region. For example, the first condition may be a condition for minimizing an amount of current to be consumed by the IVC driver. For example, in a data input/output operation, the number of memory regions selected according to the first condition may be equal to or less than the number of memory regions selected according to the second condition.

Referring to FIG. 5, a memory device 100 according to an embodiment of the present inventive concept uses an IVC driver having logic gates provided with information on a first condition and a second condition, to optimize the number of IVC drivers to be turned on in a data input/output operation. However, this is only illustrative and embodiments of the inventive concept are not limited thereto. For example, the IVC driver may include a logic gate including information on two or more conditions. In addition, a logic circuit 50 of the IVC driver is not limited to that illustrated in FIG. 5, and may be implemented in various forms functioning to generate an internal operating voltage from an external power supply voltage. A description of conditions for turning an IVC driver on in memory devices according to embodiments of the present inventive concept will be described later.

Figure 6:
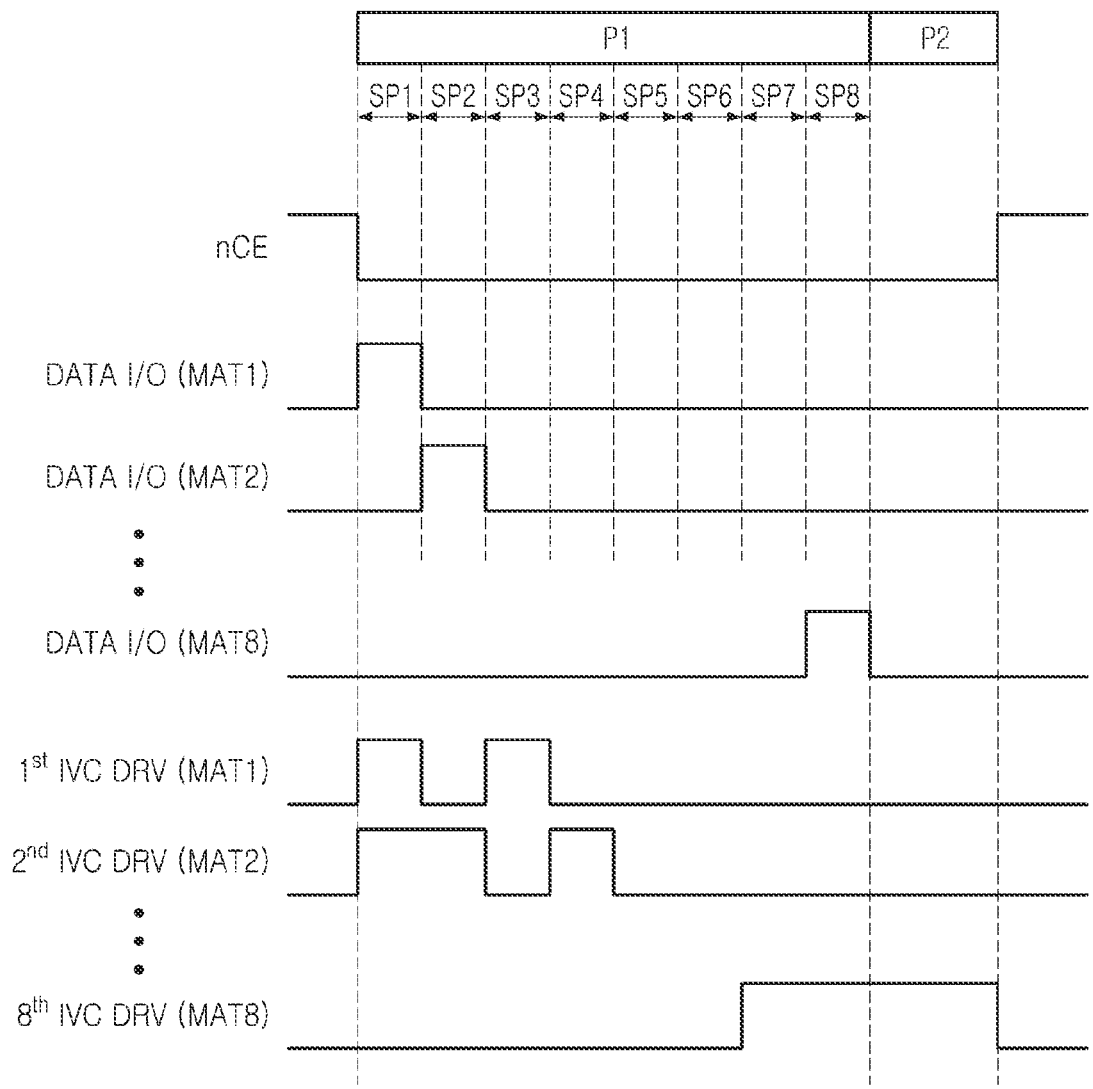
FIG. 6 is a view illustrating an input/output operation of data for a memory device according to an exemplary embodiment of the present inventive concept.

FIG. 6 is a view illustrating input/output operation of data for a memory device according to an exemplary embodiment of the present inventive concept.

Referring to FIG. 6, a memory device according to an embodiment of the present inventive concept may input/output data to/from a plurality of memory cells by executing a predetermined operation. For example, an operation of inputting/outputting data to/from a plurality of memory cells may be sequentially performed for each of the memory regions, separate from each other. For example, an input/output operation of data for a plurality of memory cells respectively included in a plurality of memory regions MAT1, MAT2, . . . , and MAT8, may include a first period P1 in which data input/output signals DATA I/O are sequentially activated to sequentially input/output the data, and a second period P2 in which the data input/output signals DATA I/O are deactivated after the first period P1. For example, in the first period P1 and the second period P2, a chip enable signal nCE received from an external memory controller is in an enable state (e.g., a low level). Referring to FIG. 2 together, in a semiconductor device according to an exemplary embodiment of the present inventive concept, the external memory controller 10 and the plurality of signals CLE, ALE, nWE, nRE, DQS, DQ, and nR/B may be transmitted and received, in the first period P1 and the second period P2 when the chip enable signal nCE is in an enable state. Therefore, the control logic circuit 22 included in the semiconductor device 20 may receive a command CMD and an address ADDR, to control an operation of the semiconductor device. For example, a memory device according to an exemplary embodiment of the present inventive concept may input/output data to/from the plurality of memory regions MAT1, MAT2, . . . , and MAT8 through the first period P1 and the second period P2.

The first period P1 includes a plurality of sub-periods SP1, SP2, . . . , and SP8 respectively corresponding to the plurality of memory regions MAT1, MAT2, . . . , and MAT8. The memory device 20 may input/output data in the sub-periods respectively corresponding to the plurality of memory regions MAT1, MAT2, . . . , and MAT8. For example, the memory device 20 may input/output data to/from a first memory region MAT1 in a first sub-period SP1, and may input/output data to/from a second memory region MAT2 in a second sub-period SP2 after the first sub-period SP1. Similarly, data may be input/output to/from third to eighth memory regions MAT3, MAT4, . . . , and MAT8 in third to eighth sub-periods SP3, SP4, . . . , and SP8, respectively, sequentially performed.

As described above, in order to input/output data to/from the plurality of memory regions MAT1, MAT2, . . . , and MAT8, it may be necessary to convert an external power supply voltage into an internal operating voltage. In a memory device according to an exemplary embodiment of the present inventive concept, an external power supply voltage is converted into an internal operating voltage by a plurality of analog circuits. For example, a plurality of analog circuits are selectively turned on according to a memory region in which input/output of data is performed, and the plurality of analog circuits to be turned on, generate an internal operating voltage for operating a memory region corresponding to each of the analog circuits. A memory region in which input/output of data is performed in a sub-period may not be identical to a memory region including a plurality of analog circuits to be turned on. For example, a plurality of analog circuits included in at least one of a memory region in which input/output of data is not performed may be turned on, together with a plurality of analog circuits included in a memory region in which input/output of data is performed. For example, a memory region in which input/output of data is performed may be defined as an input/output memory region, and a memory region including a memory region including a plurality of analog circuits to be turned on, may be defined as a selected memory region. The input/output memory region and the selected memory region may be sequentially changed, as input/output of data is performed.

Referring to FIG. 6, in relation to an input/output operation of data for a memory device according to an exemplary embodiment of the present inventive concept, a chip enable signal nCE is in an enable state in a first period P1 and a second period P2. The first period P1 may include first to eighth sub-periods SP1, SP2, . . . , and SP8. For example, in a first sub-period SP1, a data input/output signal DATA I/O of a first memory region MAT1 is activated to perform input/output of data. In this case, the first memory region MAT1 may be an input/output memory region. For example, in the first sub-period SP1, at least one of a first IVC driver $1^{st}$ IVC DRV included in the first memory region MAT1 corresponding to input/output memory region, and a second IVC driver $2^{nd}$ IVC DRV included in a second memory region MAT2 may be turned on. In this case, the first memory region MAT1 and the second memory region MAT2 may be selected memory regions.

In an embodiment, a selected memory region and not an input/output memory region, includes a preliminary input/output memory region in which input/output of data is performed after performing input/output of data for a current input/output memory region. For example, in the second memory region MAT2, input/output of data is performed in the second sub-period SP2 that occurs after the first sub-period SP1. In the first sub-period SP1, the second IVC driver $2^{nd}$ IVC DRV is turned on for the purpose of setting up the second memory region MAT2 in advance, prior to the second sub-period SP2. However, this is only illustrative and embodiments of the inventive concept are not limited thereto. In an embodiment, a selected memory region and not an input/output memory region, further includes a memory region, other than the preliminary input/output memory region.

Figure 7:
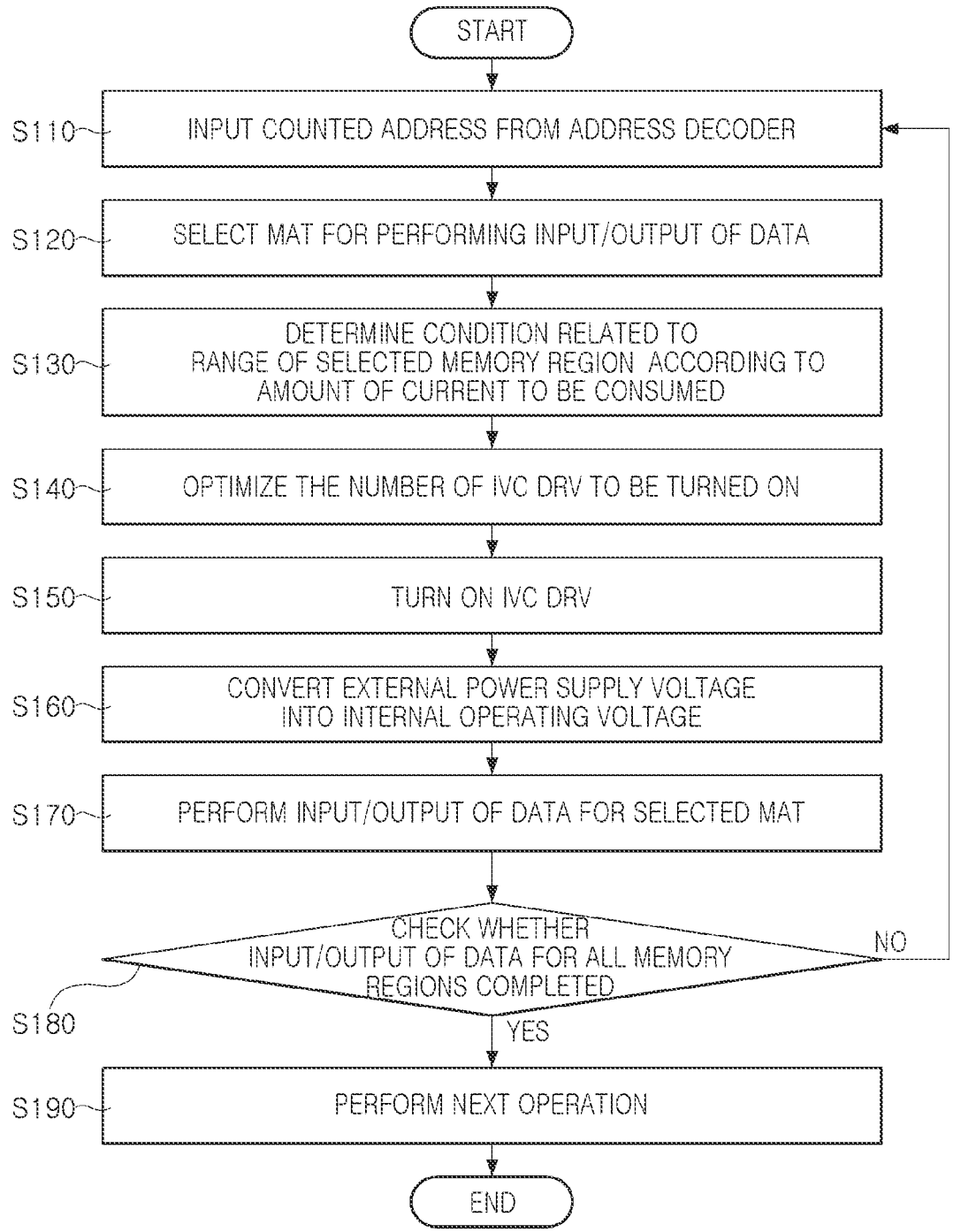
FIG. 7 is a flowchart illustrating an input/output operation of data for a memory device according to an exemplary embodiment of the present inventive concept.

FIG. 7 is a flowchart illustrating a method of performing an input/output operation of data for a memory device according to an exemplary embodiment of the present inventive concept.

Referring to FIG. 7, a memory device according to an embodiment of the present inventive concept may optimize the number of IVC drivers to be turned on, while sequentially performing input/output operation of data for a plurality of memory regions, to reduce an amount of current to be consumed.

The method of FIG. 7 includes inputting a counted address from an address decoder (S110). For example, the address decoder may output an address counted based on applied signals, and an input/output circuit may receive the address. For example, the address input to the input/output circuit may be a column address.

The method of FIG. 7 includes the input/output circuit selecting an input/output memory region for performing input/output of data, based on the received address (S120). An external power supply voltage may need to be converted into an internal operating voltage to perform the input/output of data. For example, the address decoder 24 could determine that the input/output memory region corresponds to memory region 111 in FIG. 4 by performing a calculation on the received address. For example, if the addresses ranges from 0 to 799, addresses 0 to 199 could correspond to memory region 111, addresses 200 to 399 could correspond to memory region 112, addresses 400 to 599 could correspond to memory region 113, and addresses 600 to 799 could correspond to memory region 112. The selected an input/output memory region may correspond to a given MAT from among a plurality of MATs.

In a memory device according to an embodiment of the present inventive concept, an external power supply voltage is converted into an internal operating voltage by an IVC driver. The method of FIG. 7 further includes a control logic circuit included in the memory device determining a condition related to a range of a selected memory region according to an amount of current to be consumed required for operation of the memory device (S130).

The method of FIG. 7 further includes the control logic circuit optimizing the number of IVC drivers to be turned on (S140).

The method of FIG. 7 further includes turning on the optimized number of IVC drivers (S150).

The method of FIG. 7 further includes the optimized number of IVC drivers converting the external power supply voltage into an internal operating voltage for performing input/output of data in the input/output memory region (S160). For example, the internal operating voltage may vary according to the operation of the selected memory region.

The method of FIG. 7 further includes a memory device according to an embodiment of the present inventive concept using the converted internal operating voltage to perform input/output of data for a selected memory region (S170).

Input/output of data for a plurality of memory regions may be sequentially performed in a plurality of sub-periods as described above. For example, after performing the input/output of data for the selected memory region, a process of checking whether input/output of data for all memory regions has completed is performed (S180). When there is a memory region in which input/output of data has not completed, operations S110 to S180 of re-inputting a newly counted address from the address decoder may be repeatedly performed. When input/output of data for all the memory regions has completed, a next operation of the memory device may be performed after moving to the second period (S190).

The flowchart of the operation of the memory device illustrated in FIG. 7 is only illustrative and embodiments of the inventive concept are not limited thereto. Memory devices according to embodiments of the present inventive concept use a technique that selectively turns on an IVC driver based on an address counted from an address decoder, and may sequentially operate a plurality of memory regions by using this technique. Other operations may be omitted or changed, and, in addition, may be performed in a changed order.

Figure 8:
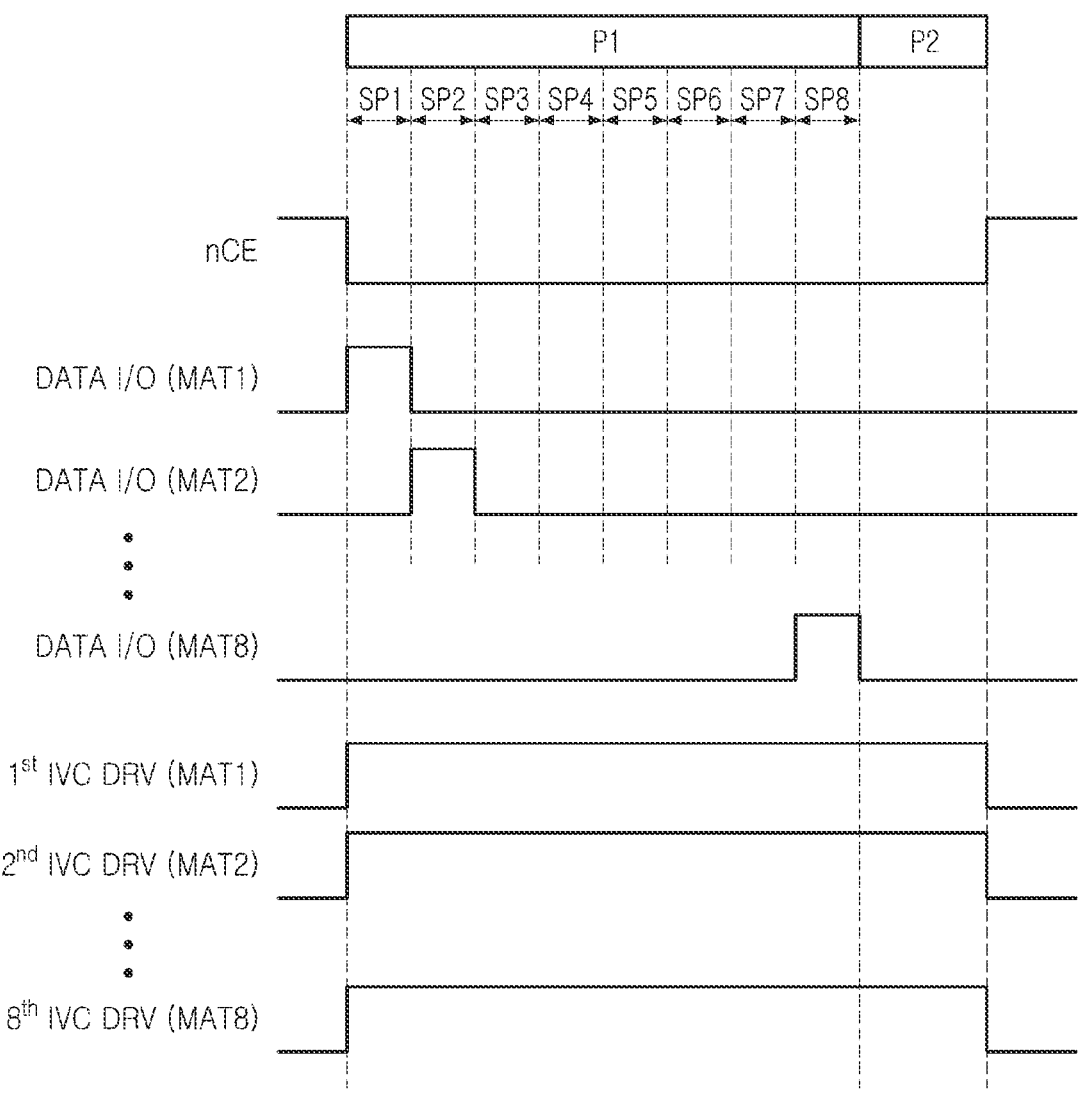
FIG. 8 is a view illustrating an input/output operation of data for a general memory device.

FIG. 8 is a view illustrating an input/output operation of data for a general memory device.

A general memory device may operate, in a similar manner to that of the memory device according to the embodiment of the present inventive concept illustrated in FIG. 6. For example, a general memory device may use an IVC driver to convert an external power supply voltage into an internal operating voltage, and may use the converted internal operating voltage to sequentially perform input/output of data for a plurality of memory regions.

In addition, referring to FIG. 8, in the general memory device, an input/output operation of data for a plurality of memory cells respectively included in a plurality of memory regions MAT1, MAT2, . . . , and MAT8 includes a first period P1 in which data input/output signals DATA I/O are sequentially activated to sequentially input/output the data, and a second period P2 in which the data input/output signals DATA I/O are deactivated after the first period P1. The first period P1 may include a plurality of sub-periods SP1, SP2, . . . , and SP8 respectively corresponding to the plurality of memory regions MAT1, MAT2, . . . , and MAT8. The general memory device may input/output data in the sub-periods respectively corresponding to the plurality of memory regions MAT1, MAT2, . . . , and MAT8. In the first period P1 and the second period P2, a chip enable signal nCE received from an external memory controller is in an enable state (e.g., a low level).

Unlike a memory device according to an embodiment of the present inventive concept illustrated in FIG. 6, IVC drivers (i.e., 1$^{st}$ IVC DRV, 2$^{nd}$ IVC DRV, . . . , and 8$^{th}$ IVC DRV) included in the general memory device are always turned on in the first period P1 and the second period P2, regardless of data input/output signals DATA I/O of the memory regions MAT1, MAT2, . . . , and MAT8. For example, a first memory region MAT1 may include a plurality of first IVC drivers 1$^{st}$ IVC DRV, and the plurality of first IVC drivers 1$^{st}$ IVC DRV may convert an external power supply voltage into an internal operating voltage required for operation of the first memory region MAT1. In this case, at least one of the plurality of first IVC drivers 1$^{st}$ IVC DRV is turned on. The turned on IVC driver maintains a turned on state for the entire first period P1, as well as a first sub-period SP1 in which input/output of data is performed on the first memory region MAT1.

As a data input/output speed of a non-volatile memory device increases, the number of IVC drivers used in the non-volatile memory device may increase. When the increased number of IVC drivers operate, in a similar manner to the general memory device illustrated in FIG. 8, an amount of current to be unnecessarily consumed may increase. Therefore, when the IVC driver used in the non-volatile memory device is selectively turned on, in a similar manner to the memory device according to an embodiment of the present inventive concept, an amount of current to be consumed may be reduced, and performance of the non-volatile memory device may be improved.

Figure 9:
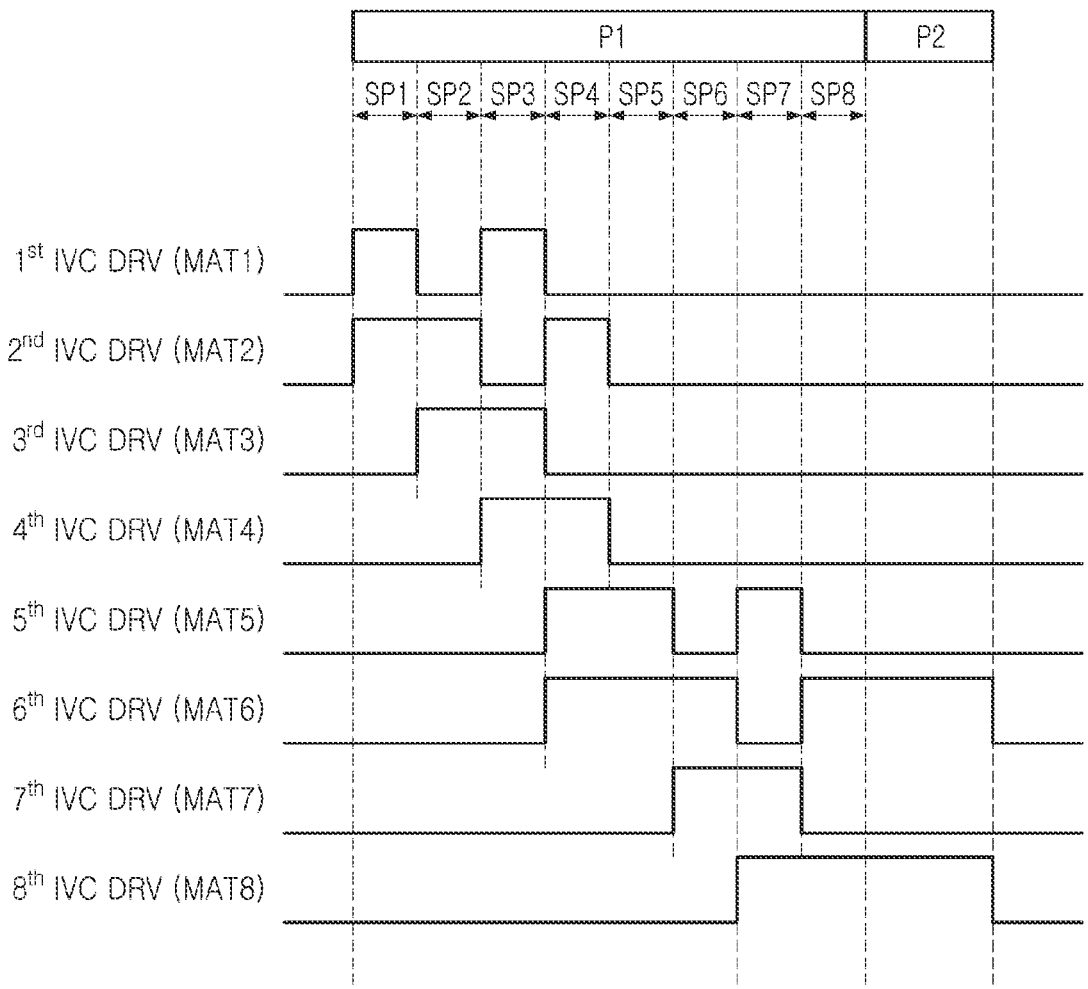
FIG. 9 is a view illustrating an input/output operation of data for a memory device according to an exemplary embodiment of the present inventive concept.
Figure 10:
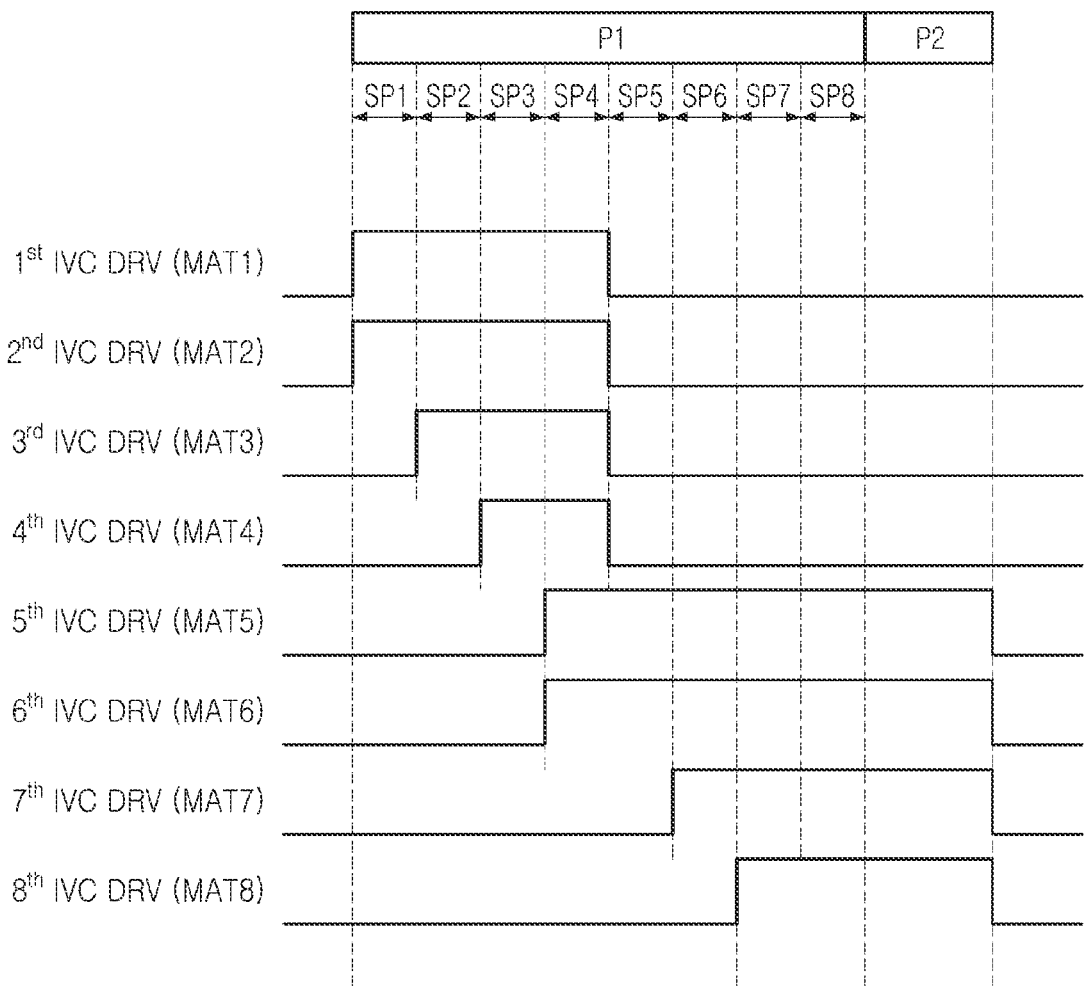
FIG. 10 is a view illustrating an input/output operation of data for a memory device according to an exemplary embodiment of the present inventive concept.

FIGS. 9 and 10 are views illustrating an input/output operation of data for a memory device according to an exemplary embodiment of the present inventive concept.

FIG. 9 illustrates an input/output operation of data for a memory device under a first condition for minimizing an amount of current to be consumed by an IVC driver. FIG. 10 may illustrate an input/output operation of data for a memory device under a second condition, different from the first condition, in generating an internal operating voltage. For example, a memory device according to an exemplary embodiment of the present inventive concept may optimize the number of IVC drivers turned on during an input/output operation of data according to a first condition and a second condition, to reduce an amount of current to be unnecessarily consumed.

A memory device according to an exemplary embodiment of the present inventive concept minimizes the number of IVC drivers turned on in a plurality of sub-periods SP1, SP2, . . . , and SP8, to minimize an amount of current to be consumed by the IVC drivers. The general memory device illustrated in FIG. 8 may include eight (8) memory regions MAT1, MAT2, . . . , and MAT8. As described above, a plurality of analog circuits, turned on to generate an internal operating voltage, may maintain a turned on state in a first period P1. For example, the number of memory regions including a plurality of analog circuits turned on in a first period may be eight. Since analog circuits turned on in an eighth sub-period SP8 maintain a turned on state in a second period P2, the number of memory regions including a plurality of analog circuits turned on in the second period is also eight.

In a memory device according to an exemplary embodiment of the present inventive concept in which an IVC driver is selectively turned on according to a first condition and a second condition, the number of memory regions including a plurality of analog circuits to be turned on may be smaller than those described above.

Referring to FIG. 9, in a memory device according to an exemplary embodiment of the present inventive concept, to selectively turn-on an IVC driver according to a first condition, the number of memory regions including a plurality of analog circuits turned on during a first period may be range between 2 and 4. For example, the number of memory regions including a plurality of analog circuits turned on in a first sub-period SP1, a second sub-period SP2, a fifth sub-period SP5, a sixth sub-period SP6, and an eighth sub-period SP8 is two. For example, the first and second IVC drivers are turned on during the first sub-period SP1, the second and third IVC drivers are turned on during the second sub-period SP2, the fifth and sixth IVC drivers are turned on during the fifth sub-period SP5, and the sixth and eighth IVC drivers are turned on the during the eighth sub-period SP. For example, the number of memory regions including a plurality of analog circuits turned on in a third sub-period SP3 and a seventh sub-period SP7 is three. For example, the first, third, and fourth IVC drivers are turned on during the third sub-period SP3 and the fifth, seventh, and eighth IVC drivers are turned on during the seventh sub-period SP7. For example, the number of memory regions including a plurality of analog circuits turned on in a fourth sub-period SP4 is four. For example, the second, fourth, fifth, and sixth IVC drivers are turned on during the fourth sub-period SP4. For example, the memory device operating under the first condition may generate an internal operating voltage for input/output of data for the memory region in an average number of about 2.5 memory regions in the first period. In the second period, a plurality of analog circuits turned on in a sixth memory region MAT6 and an eighth memory region MAT8, including the analog circuits turned on in the eighth sub-period SP8, may be included.

Referring to FIG. 10, in a memory device according to an exemplary embodiment of the present inventive concept, to selectively turn-on an IVC driver according to a second condition, the number of memory regions including a plurality of analog circuits turned on during a first period may range between 2 and 6. For example, the number of memory regions including a plurality of analog circuits turned on in a first sub-period SP1 and a fifth sub-period SP5 may be two. For example, the number of memory regions including a plurality of analog circuits turned on in a second sub-period SP2 and a sixth sub-period SP6 may be three. For example, the number of memory regions including a plurality of analog circuits turned on in a third sub-period SP3, a seventh sub-period SP7, and an eighth sub-period SP8 may be four. For example, the number of memory regions including a plurality of analog circuits turned on in a fourth sub-period SP4 may be six. For example, the memory device operating under the second condition may generate an internal operating voltage for input/output of data for the memory region in an average number of about 3.5 memory regions in the first period. In the second period, a plurality of analog circuits turned on in a fifth memory region MAT5 to an eighth memory region MAT8, including the analog circuits turned on in the eighth sub-period SP8, may be included.

An amount of current to be consumed by the IVC drivers may be reduced by about 40% to 70%, as compared to the operation of the general memory device illustrated in FIG. 8. Therefore, an amount of current to be unnecessarily consumed may be reduced, and performance of the nonvolatile memory device may be further improved. However, this is only illustrative, and embodiments of the inventive concept are not limited thereto. For example, the number of memory regions including a plurality of analog circuits that may be turned on under a certain rule may vary according to conditions.

FIGS. 11 to 24 are plan views illustrating an operation of the memory device according to the embodiments illustrated in FIGS. 9 and 10.

In a memory device according to an embodiment of the present inventive concept, the number of memory regions including a plurality of analog circuits to be turned on may vary according to conditions, as described above. In order to optimize the number of IVC drivers, a memory region including a plurality of analog circuits to be turned on may be selected under a certain rule. For example, the selected memory region may include an input/output memory region and a preliminary input/output memory region. For example, the input/output memory region may be a memory region including a plurality of memory cells in which input/output of data is performed, and may be a memory region corresponding to a current sub-period. For example, the preliminary input/output memory region may be a memory region including a plurality of memory cells in which input/output of data is performed in a next sub-period, and may be a memory region corresponding to the next sub-period.

In a memory device according to an embodiment of the present inventive concept, when another memory region is disposed between a pad region and a memory region such as a third memory region, a fourth memory region, a seventh memory region, and an eighth memory region, the another memory region may serve as a path between the pad region and the memory region, respectively. For example, in relation to an input/output operation of data for the memory device, at least one of a plurality of analog circuits included in the memory region disposed in the path may be further turned on.

Figure 11:
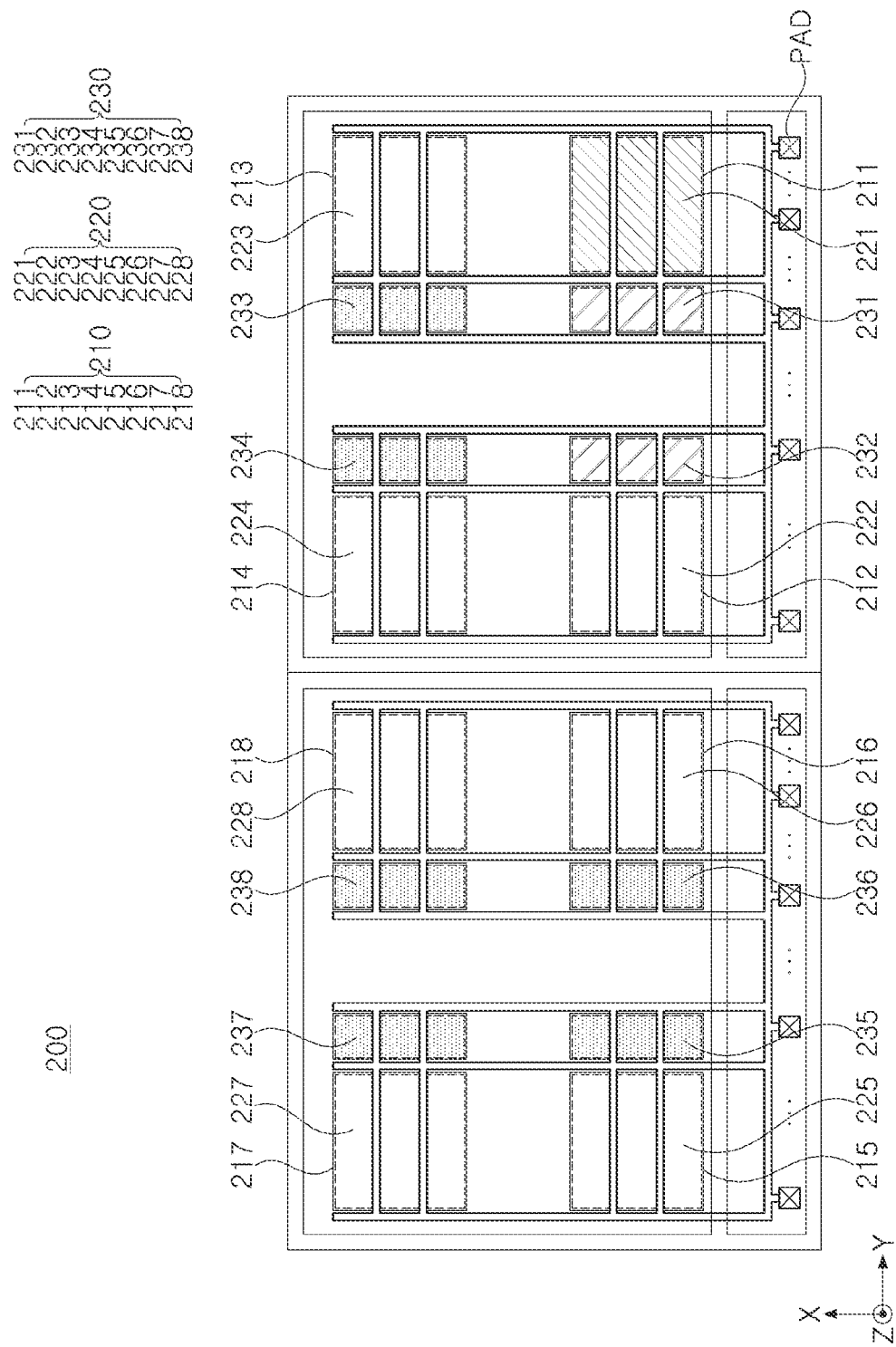
FIGS. 11 to 24 are plan views illustrating operation of the memory device according to the embodiments illustrated in FIGS. 9 and 10.

FIG. 11 illustrates an input/output memory region and a selected memory region in a first sub-period in a memory device 200 according to an exemplary embodiment of the present inventive concept, which may be the same in a first condition and a second condition. The memory device 200 includes a memory cell array including a plurality of memory regions 211, 212, . . . , and 218 (i.e., 210) having a plurality of memory cells 221, 222, . . . , and 228 (i.e., 220) and a plurality of peripheral circuits 231, 232, . . . , and 238 (i.e., 230) corresponding thereto. For example, input/output memory region in which input/output of data is performed in a first sub-period may be a first memory region 211. At least one of a plurality of first analog circuits 231 included in the first memory region 211 that may be input/output memory region in the first sub-period may be turned on. In addition, at least one of a plurality of second analog circuits 232 included in a second memory region 212 that may be a preliminary input/output memory region in the first sub-period may also be turned on. However, the present inventive concept is not limited thereto, and the memory device 200 according to an embodiment may turn-on at least one of a plurality of third analog circuits 233, to set up input/output of data in a third memory region 213 in the first sub-period in advance.

Figure 12:
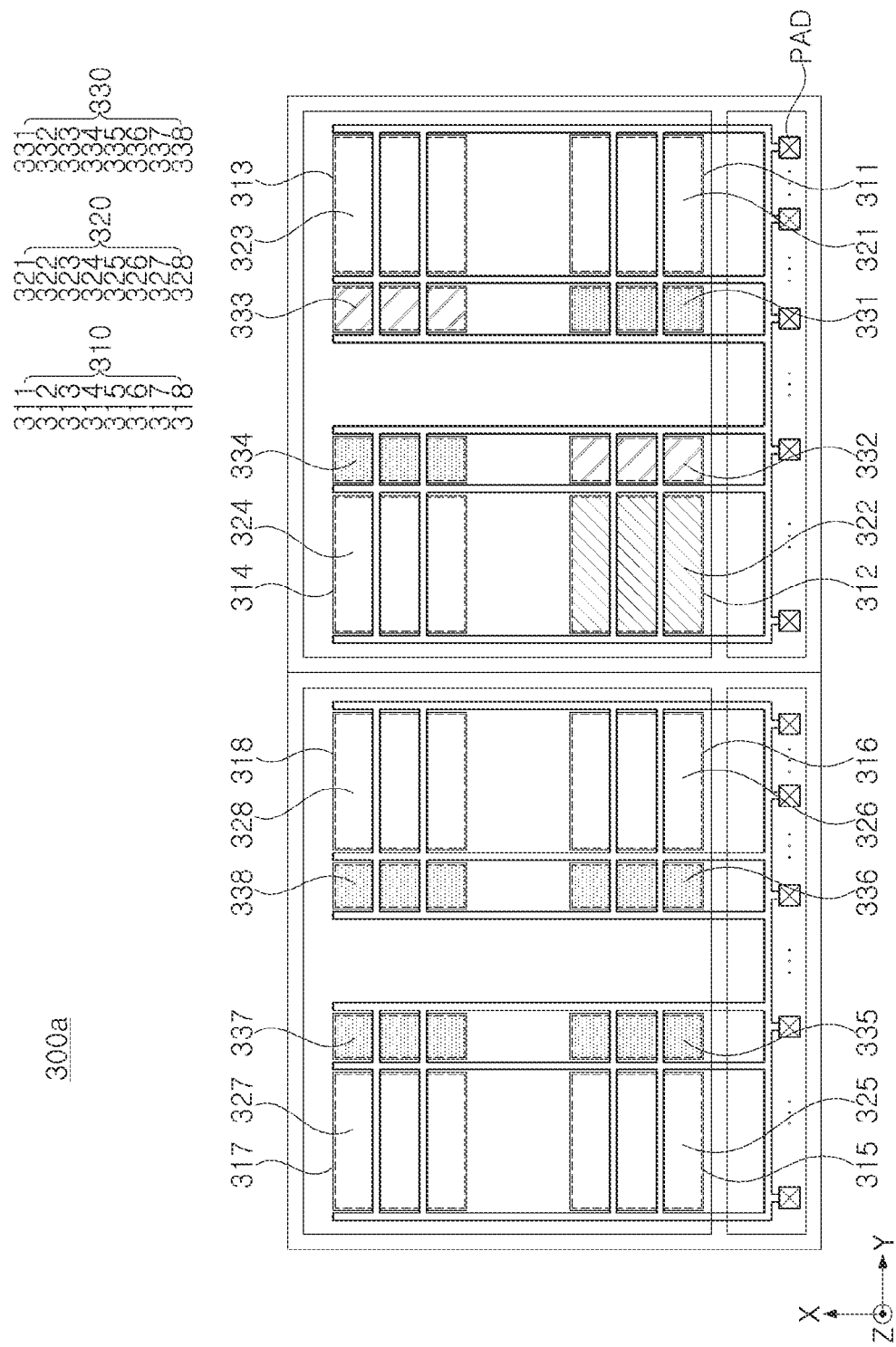
Figure 13:
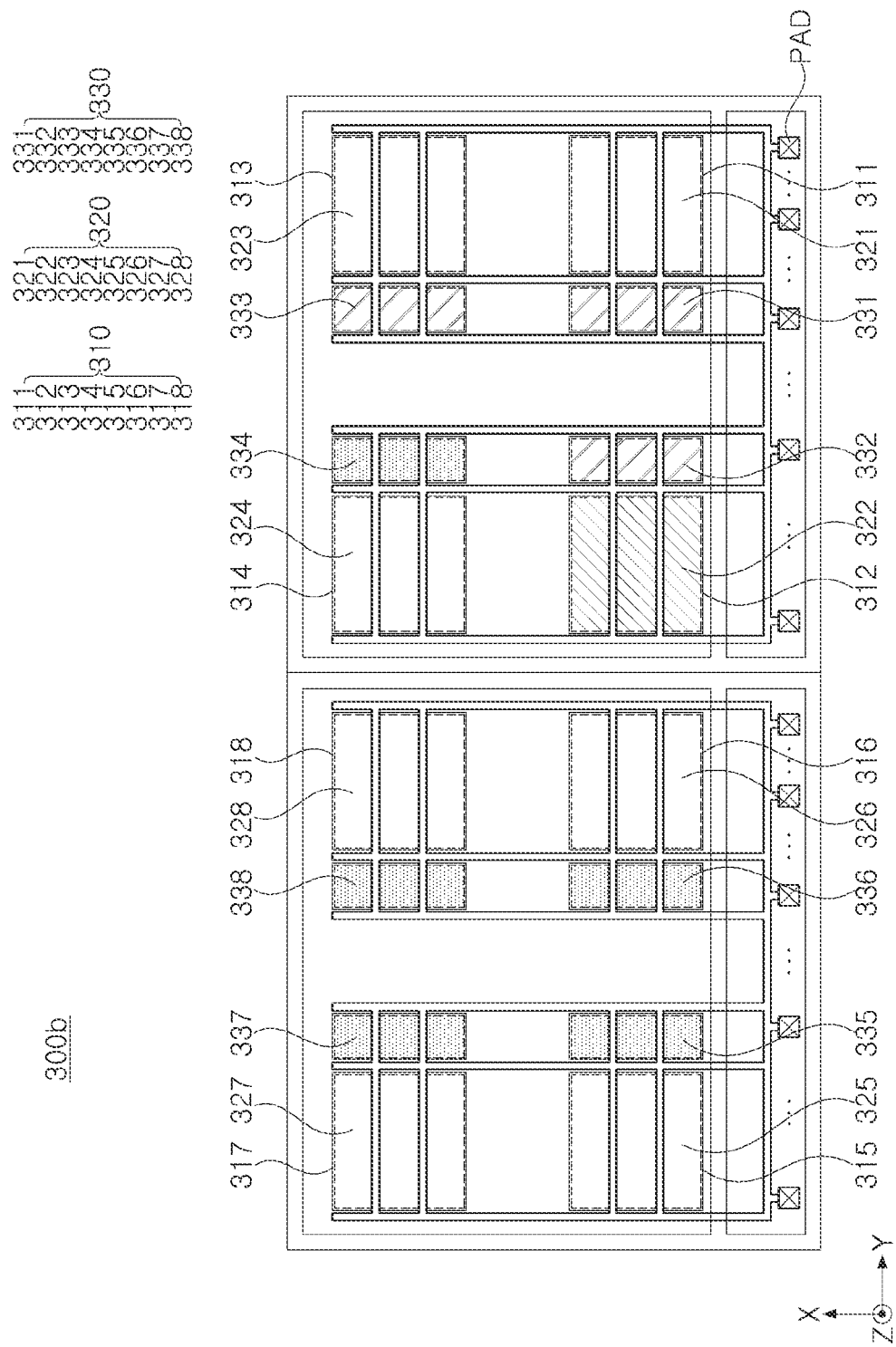

FIGS. 12 and 13 illustrate input/output memory region and a selected memory region in a second sub-period in memory devices 300*a* and 300*b* according to embodiments of the present inventive concept. A memory device 300*a* or 300*b* according to an embodiment of the present inventive concept includes a memory cell array including a plurality of memory regions 311, 312, . . . , and 318 (i.e., 310) having a plurality of memory cells 321, 322, . . . , and 328 (i.e., 320) and a plurality of peripheral circuits 331, 332, . . . , and 338 (i.e., 330) corresponding thereto. For example, FIG. 12 illustrates a memory device 300*a* under a first condition, and FIG. 13 illustrates a memory device 300*b* under a second condition. For example, an input/output memory region in which input/output of data is performed in the second sub-period may be a second memory region 312. At least one of a plurality of second analog circuits 332 included in the second memory region 312 that may be an input/output memory region in the second sub-period may be turned on. In addition, at least one of a plurality of third analog circuits 333 included in a third memory region 313 that may be a preliminary input/output memory region in the second sub-period may also be turned on.

A first memory region 311 may be disposed between the third memory region 313 including the third analog circuits 333 and a pad region PAD. At least one of a plurality of first analog circuits 331 included in the first memory region 311 disposed in a path may be further turned on, to transfer an external power supply voltage applied to the pad region PAD to the third memory region 313.

Figure 14:
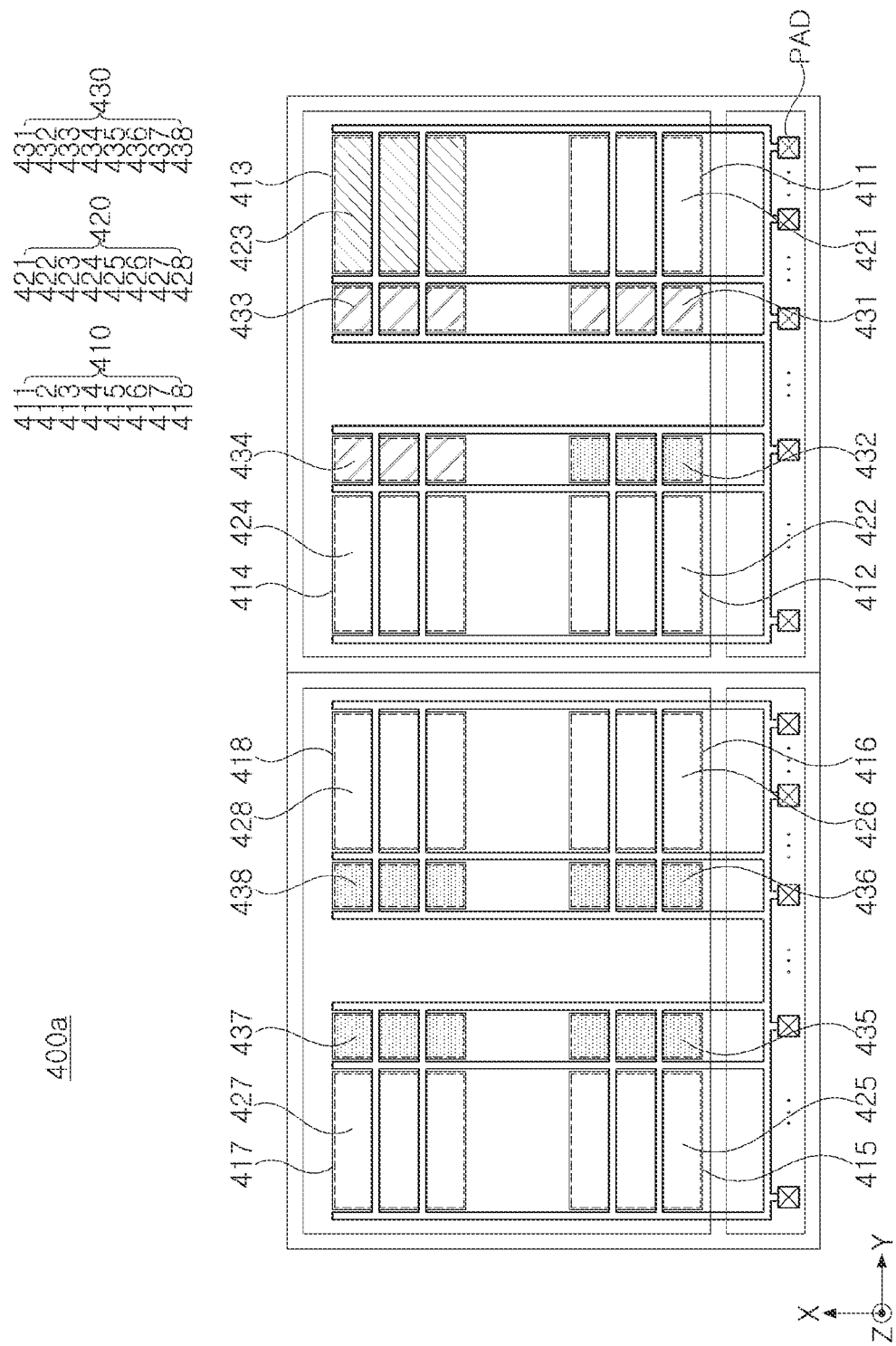
Figure 15:
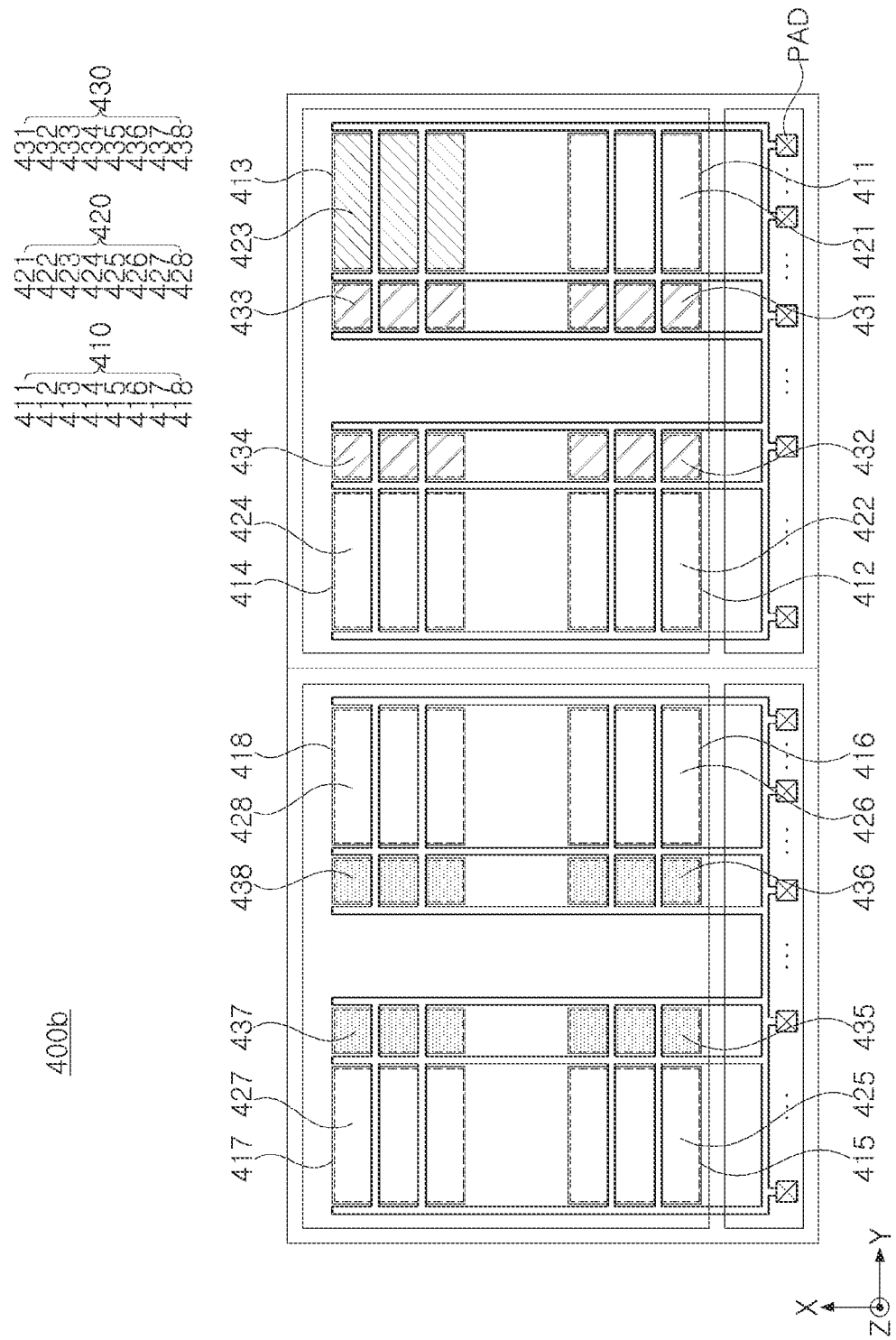

FIGS. 14 and 15 illustrate an input/output memory region and a selected memory region in a third sub-period in memory devices 400*a* and 400*b* according to an embodiment of the present inventive concept. A memory device 400*a* or 400*b* according to an embodiment of the present inventive concept includes a memory cell array including a plurality of memory regions 411, 412, . . . , and 418 (i.e., 410) having a plurality of memory cells 421, 422, . . . , and 428 (i.e., 420) and a plurality of peripheral circuits 431, 432, . . . , and 438 (i.e., 430) corresponding thereto. For example, FIG. 14 may illustrate a memory device 400*a* under a first condition, and FIG. 15 may illustrate a memory device 400*b* under a second condition. For example, an input/output memory region in which input/output of data is performed in the third sub-period may be a third memory region 413. At least one of a plurality of third analog circuits 433 included in the third memory region 413 that may be input/output memory region in the third sub-period may be turned on. In addition, at least one of a plurality of fourth analog circuits 434 included in a fourth memory region 414 that may be a preliminary input/output memory region in the third sub-period may also be turned on.

The first memory region 411 may be disposed between the third memory region 413 including the third analog circuit 433*s* and a pad region PAD. At least one of the plurality of first analog circuits 431 included in the first memory region 411 disposed in a path may be further turned on, to transfer an external power supply voltage applied to the pad region PAD to the third memory region 413. Likewise, at least one of a plurality of second analog circuits 432 included in a second memory region 412 may be further turned on, to transfer an external power supply voltage to the fourth memory region 414.

Figure 16:
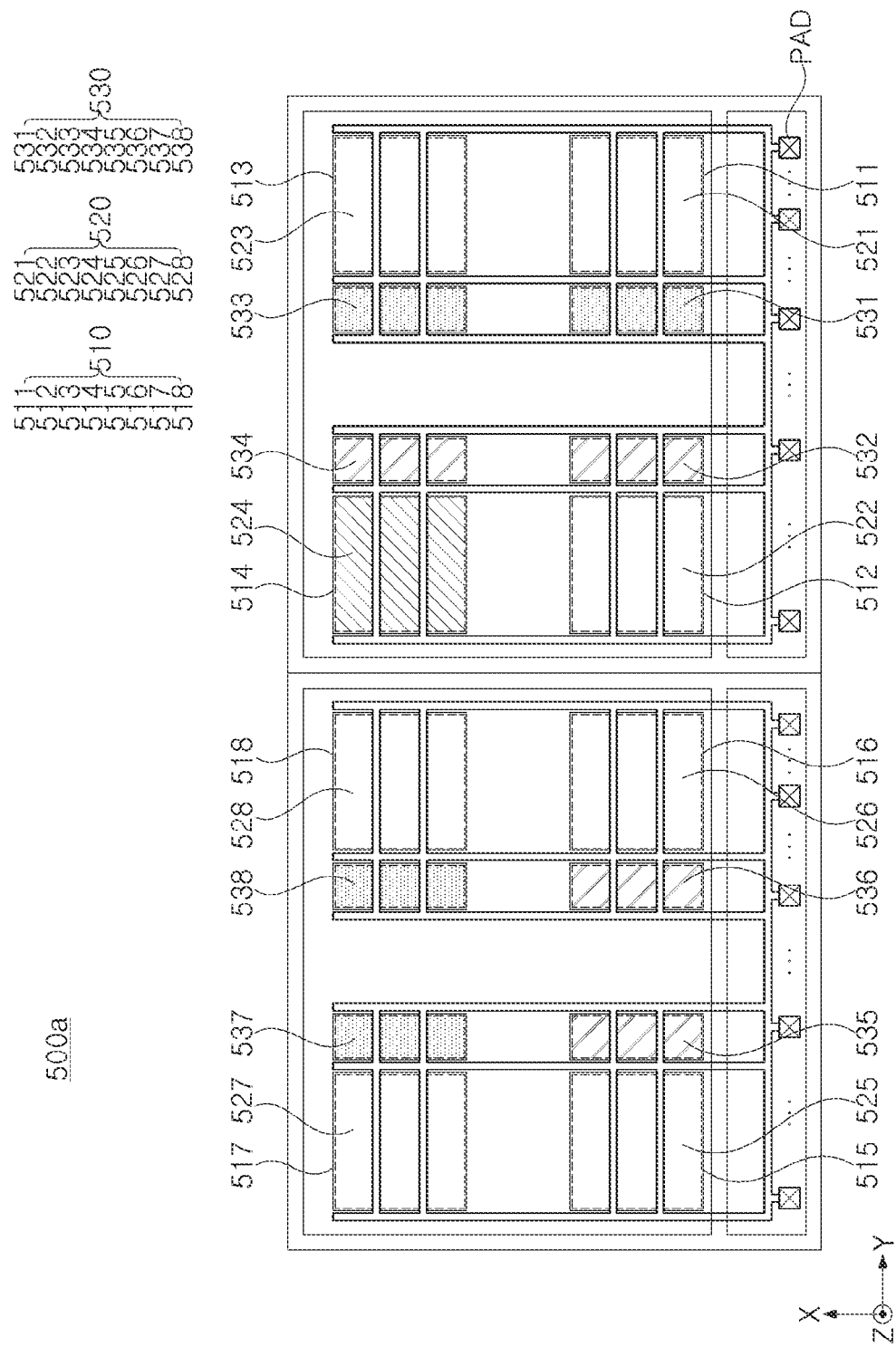
Figure 17:
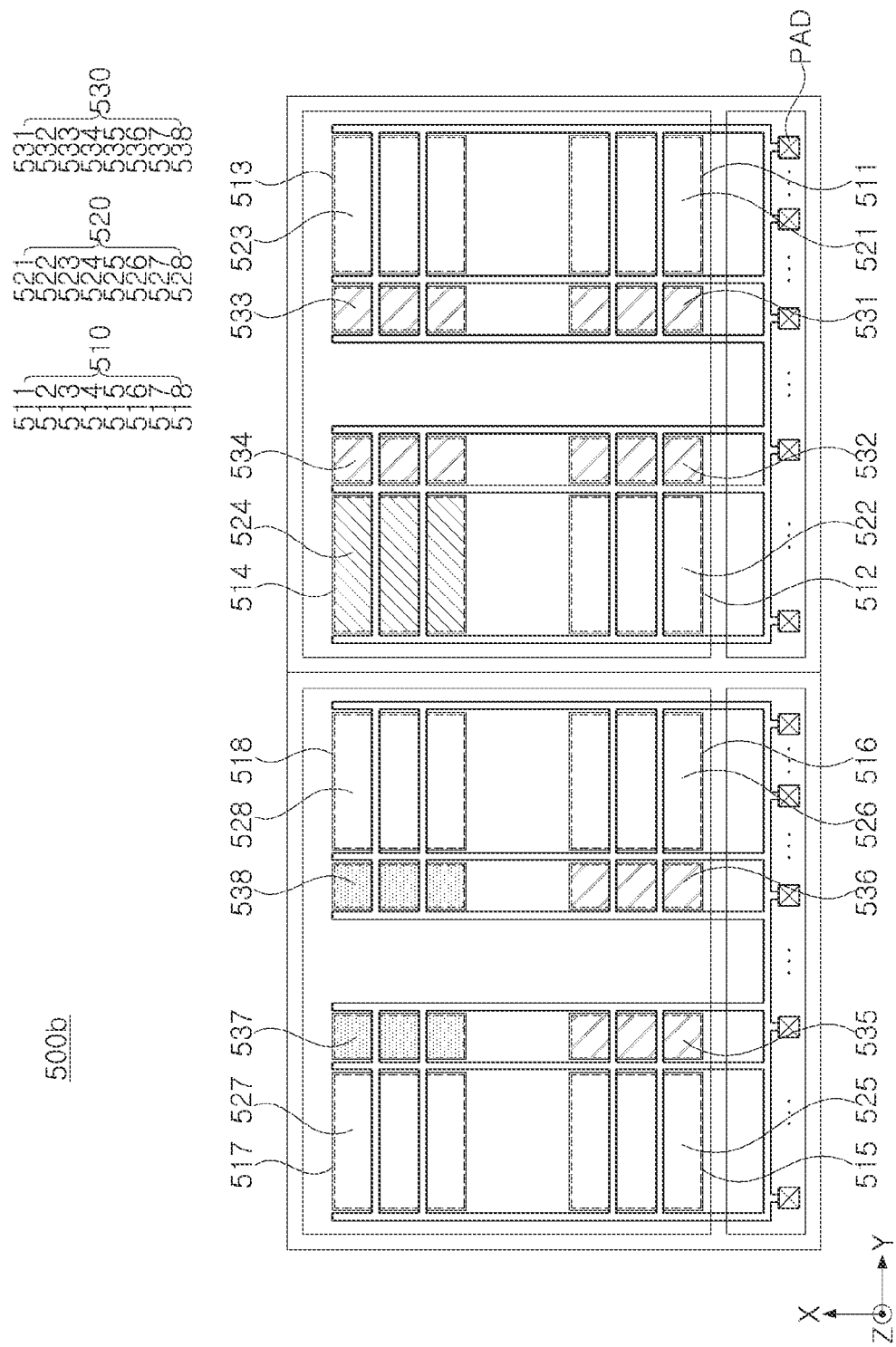

FIGS. 16 and 17 illustrate an input/output memory region and a selected memory region in a fourth sub-period in memory devices 500*a* and 500*b* according to an exemplary embodiment of the present inventive concept. A memory device 500*a* or 500*b* according to an embodiment of the present inventive concept includes a memory cell array including a plurality of memory regions 511, 512, . . . , and 518 (i.e., 510) having a plurality of memory cells 521, 522, . . . , and 528 (i.e., 520) and a plurality of peripheral circuits 531, 532, . . . , and 538 (i.e., 530) corresponding thereto. For example, FIG. 16 may illustrate a memory device 500*a* under a first condition, and FIG. 17 may illustrate a memory device 500*b* under a second condition. For example, input/output memory region in which input/output of data is performed in the fourth sub-period may be a fourth memory region 514. At least one of a plurality of fourth analog circuits 534 included in the fourth memory region 514 that may be input/output memory region in the fourth sub-period may be turned on. In addition, at least one of a plurality of fifth analog circuits 535 included in a fifth memory region 515 that may be a preliminary input/output memory region in the fourth sub-period may also be turned on.

In a similar manner to the operation in the third sub-period, at least one of a plurality of second analog circuits 532 included in a second memory region 512 disposed between the fourth memory region 514 and a pad region PAD may be further turned on. In addition, at least one of a plurality of sixth analog circuits 536 included in a sixth memory region 516 disposed between the second memory region 512 and the fifth memory region 515 may also be turned on together. At least one of a plurality of third analog circuits 533 and at least one of a plurality of first analog circuits 531 may be further turned on to improve the operations of the memory devices 500*a* and 500*b*.

Figure 18:
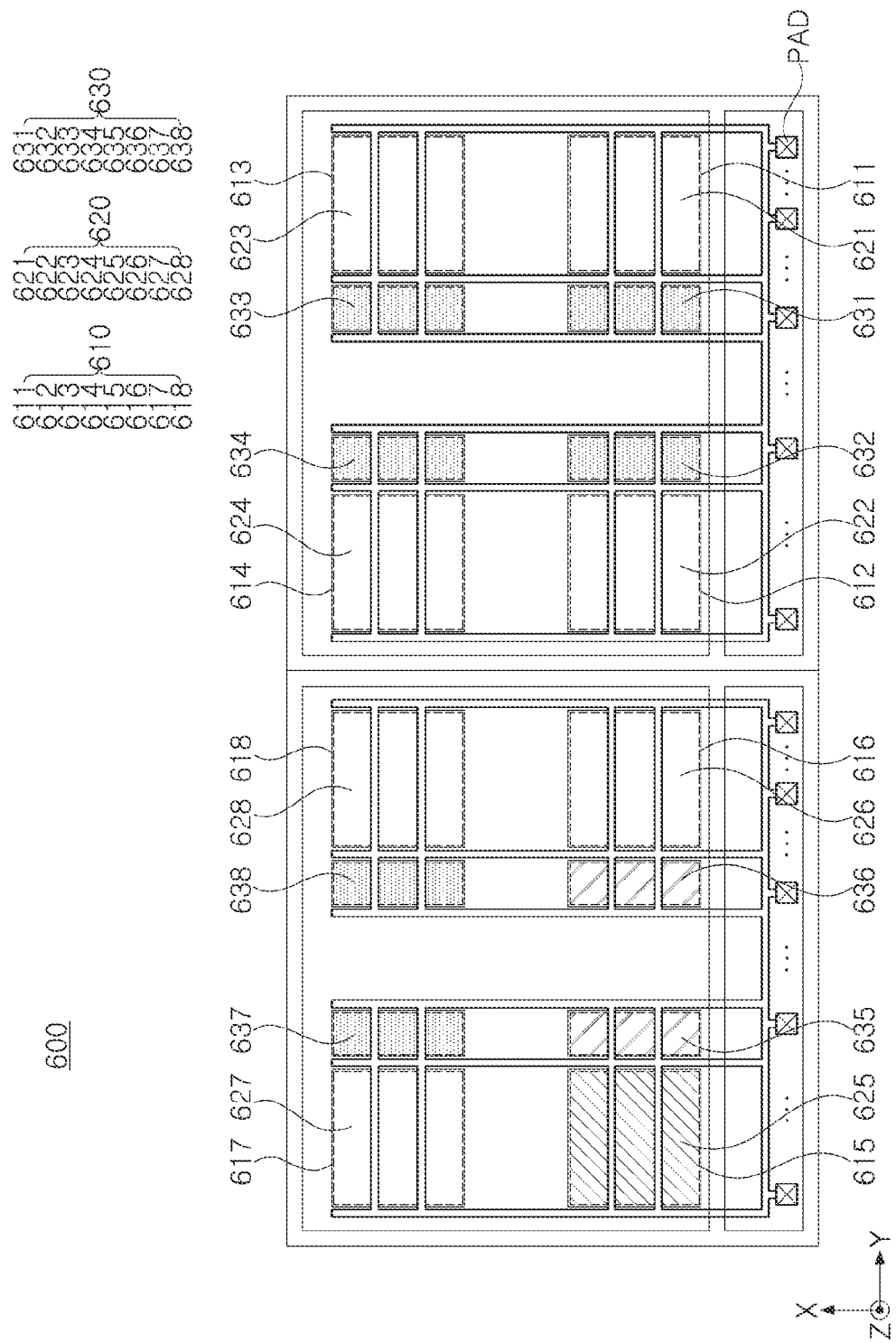

FIG. 18 illustrates an input/output memory region and a selected memory region in a fifth sub-period in a memory device 600 according to an exemplary embodiment of the present inventive concept, which may be the same in a first condition and a second condition. A memory device 600 according to an embodiment of the present inventive concept includes a memory cell array including a plurality of memory regions 611, 612, . . . , and 618 (i.e., 610) having a plurality of memory cells 621, 622, . . . , and 628 (i.e., 620) and a plurality of peripheral circuits 631, 632, . . . , and 638 (i.e., 630) corresponding thereto. For example, an input/output memory region in which input/output of data is performed in the fifth sub-period may be a fifth memory region 615. At least one of a plurality of fifth analog circuits 635 included in the fifth memory region 615 that may be input/output memory region in the fifth sub-period may be turned on. In addition, at least one of a plurality of sixth analog circuits 636 included in a sixth memory region 616 that may be a preliminary input/output memory region in the fifth sub-period may also be turned on.

Figure 19:
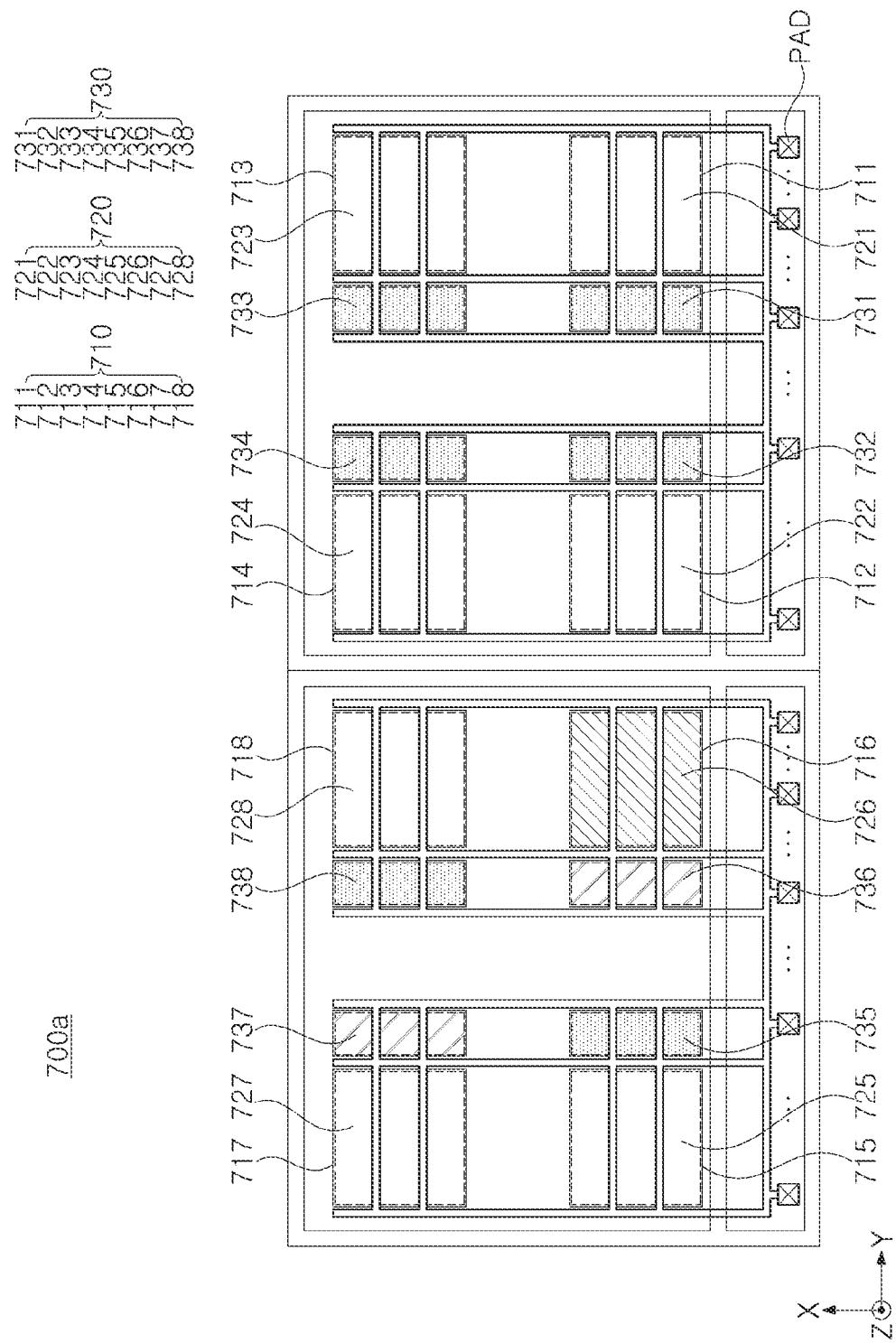
Figure 20:
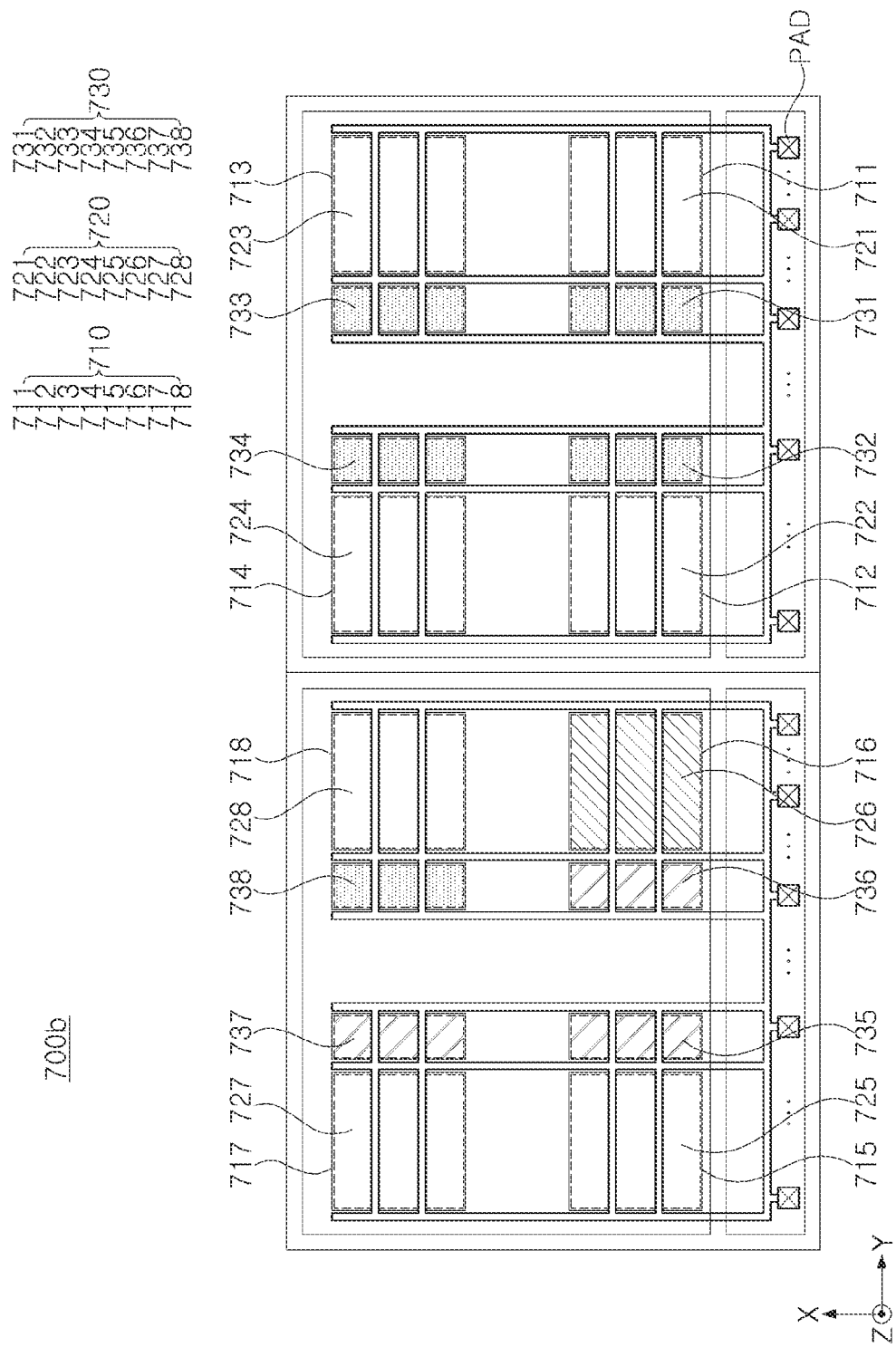

FIGS. 19 and 20 illustrate an input/output memory region and a selected memory region in a sixth sub-period in memory devices 700*a* and 700*b* according to an exemplary embodiment of the present inventive concept. A memory device 700*a* or 700*b* according to an embodiment of the present inventive concept includes a memory cell array including a plurality of memory regions 711, 712, . . . , and 718 (i.e., 710) having a plurality of memory cells 721, 722, . . . , and 728 (i.e., 720) and a plurality of peripheral circuits 731, 732, . . . , and 738 (i.e., 730) corresponding thereto. For example, FIG. 19 may illustrate a memory device 700*a* under a first condition, and FIG. 20 may illustrate a memory device 700*b* under a second condition. For example, an input/output memory region in which input/output of data is performed in the sixth sub-period may be a sixth memory region 716. At least one of a plurality of sixth analog circuits 736 included in the sixth memory region 716 that may be input/output memory region in the sixth sub-period may be turned on. In addition, at least one of a plurality of seventh analog circuits 737 included in a seventh memory region 717 that may be a preliminary input/output memory region in the sixth sub-period may also be turned on. Also, in a similar manner to the operation in the second sub-period, at least one of a plurality of fifth analog circuits 735 included in a fifth memory region 715 disposed between the seventh memory region 717 and a pad region PAD may be further turned on.

Figure 21:
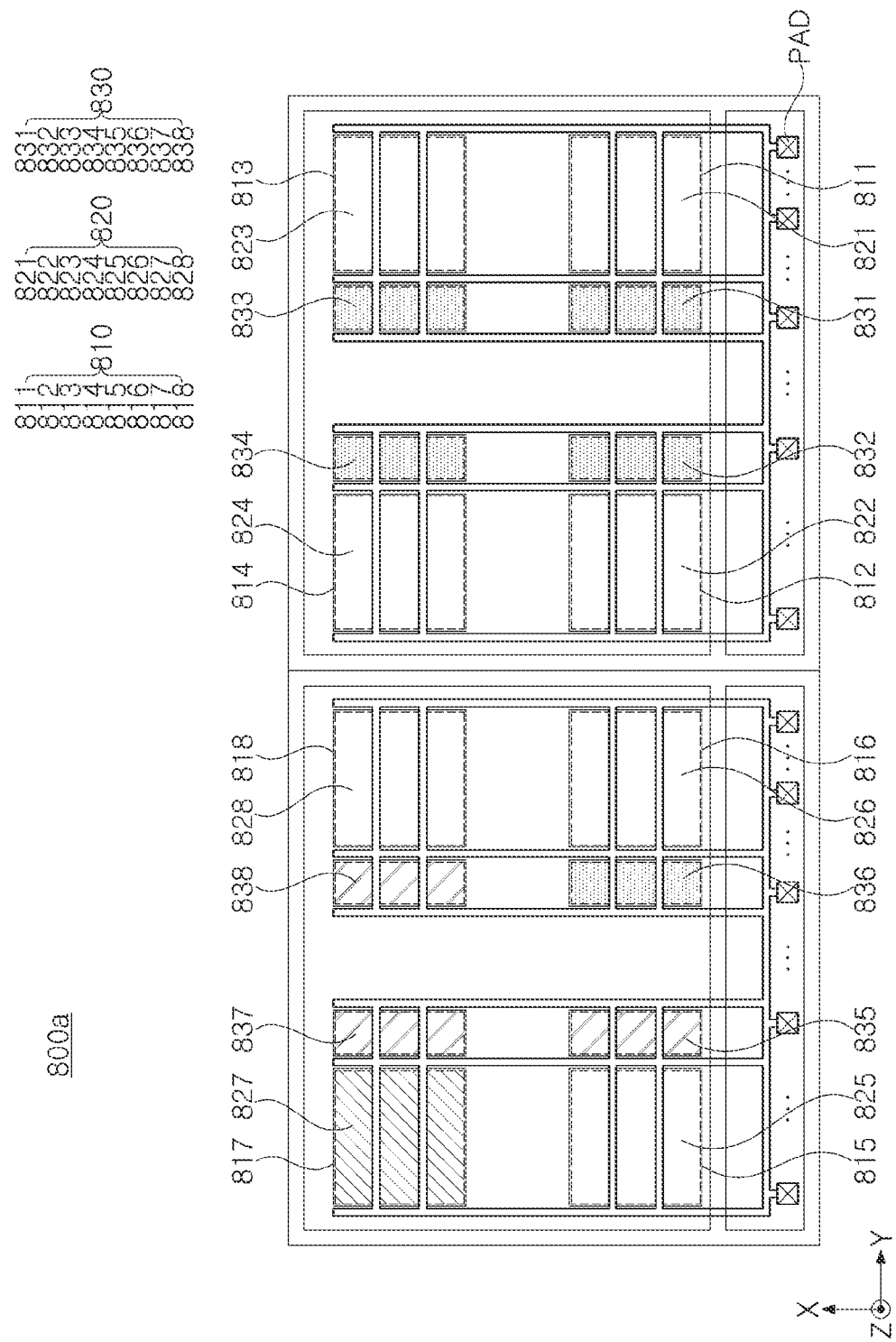
Figure 22:
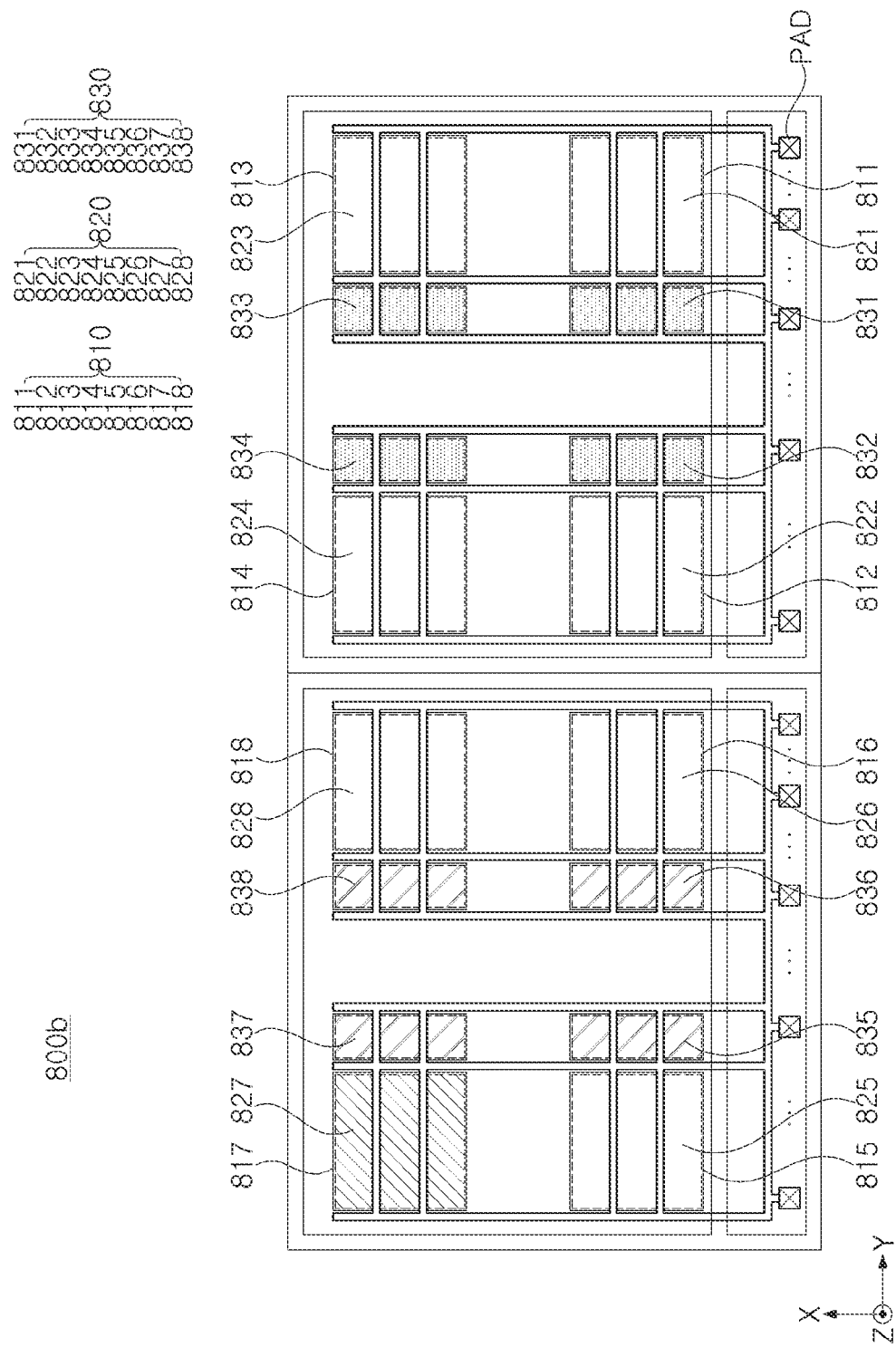

FIGS. 21 and 22 illustrate an input/output memory region and a selected memory region in a seventh sub-period in memory devices 800*a* and 800*b* according to an exemplary embodiment of the present inventive concept. A memory device 800*a* or 800*b* according to an embodiment of the present inventive concept includes a memory cell array including a plurality of memory regions 811, 812, . . . , and 818 (i.e., 810) having a plurality of memory cells 821, 822, . . . , and 828 (i.e., 820) and a plurality of peripheral circuits 831, 832, . . . , and 838 (i.e., 830) corresponding thereto. For example, FIG. 21 may illustrate a memory device 800*a* under a first condition, and FIG. 22 may illustrate a memory device 800*b* under a second condition. For example, an input/output memory region in which input/output of data is performed in the seventh sub-period may be a seventh memory region 817. At least one of a plurality of seventh analog circuits 837 included in the seventh memory region 817 that may be an input/output memory region in the seventh sub-period may be turned on. In addition, at least one of a plurality of eighth analog circuits 838 included in an eighth memory region 818 that may be a preliminary input/output memory region in the seventh sub-period may also be turned on. Also, in a similar manner to the operation in the third sub-period, at least one of a plurality of fifth analog circuits 835 included in a fifth memory region 815 disposed between the seventh memory region 817 and a pad region PAD may be further turned on. Likewise, at least one of a plurality of sixth analog circuits 836 included in a sixth memory region 816 disposed between the eighth memory region 818 and the pad region PAD may be further turned on.

Figure 23:
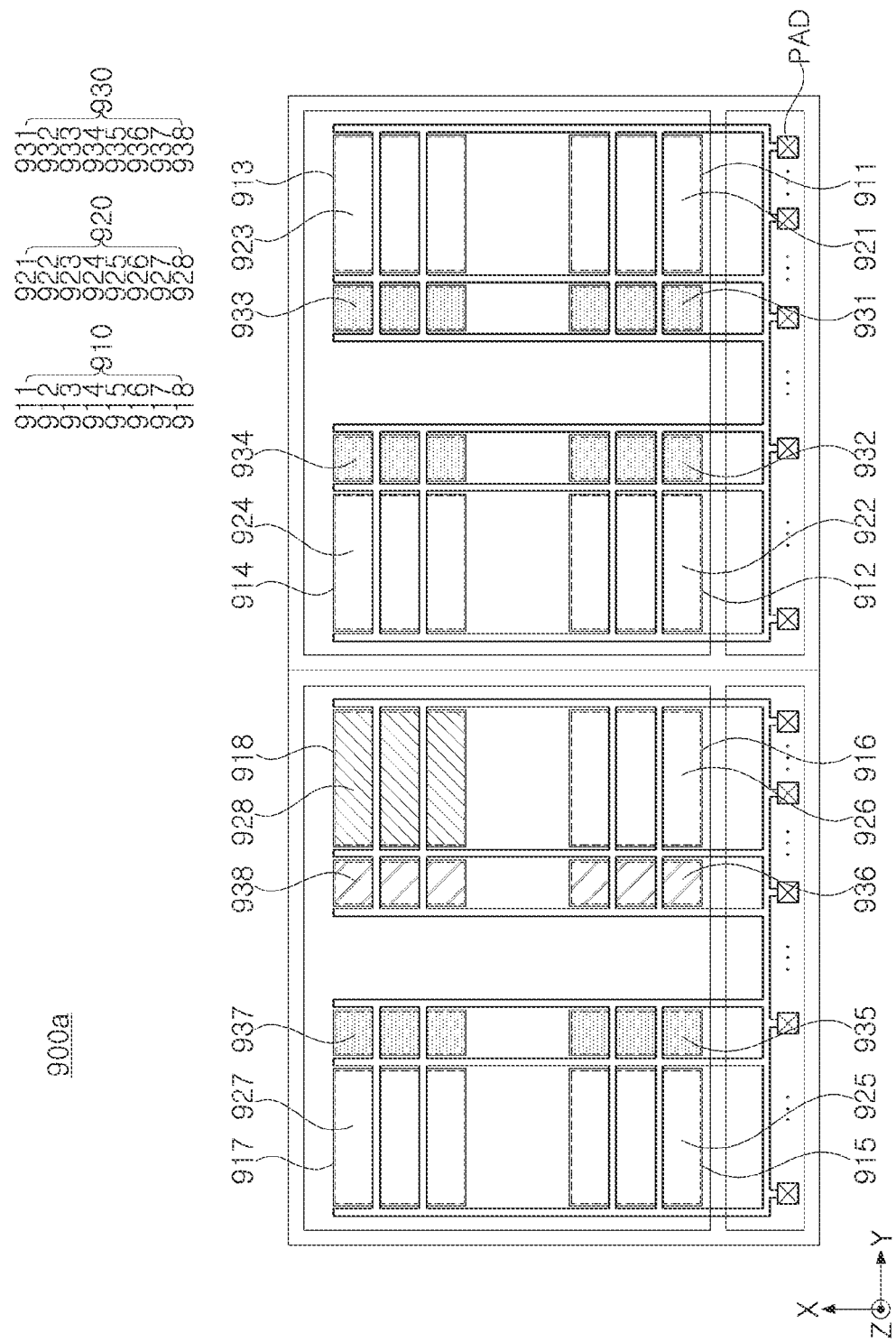
Figure 24:
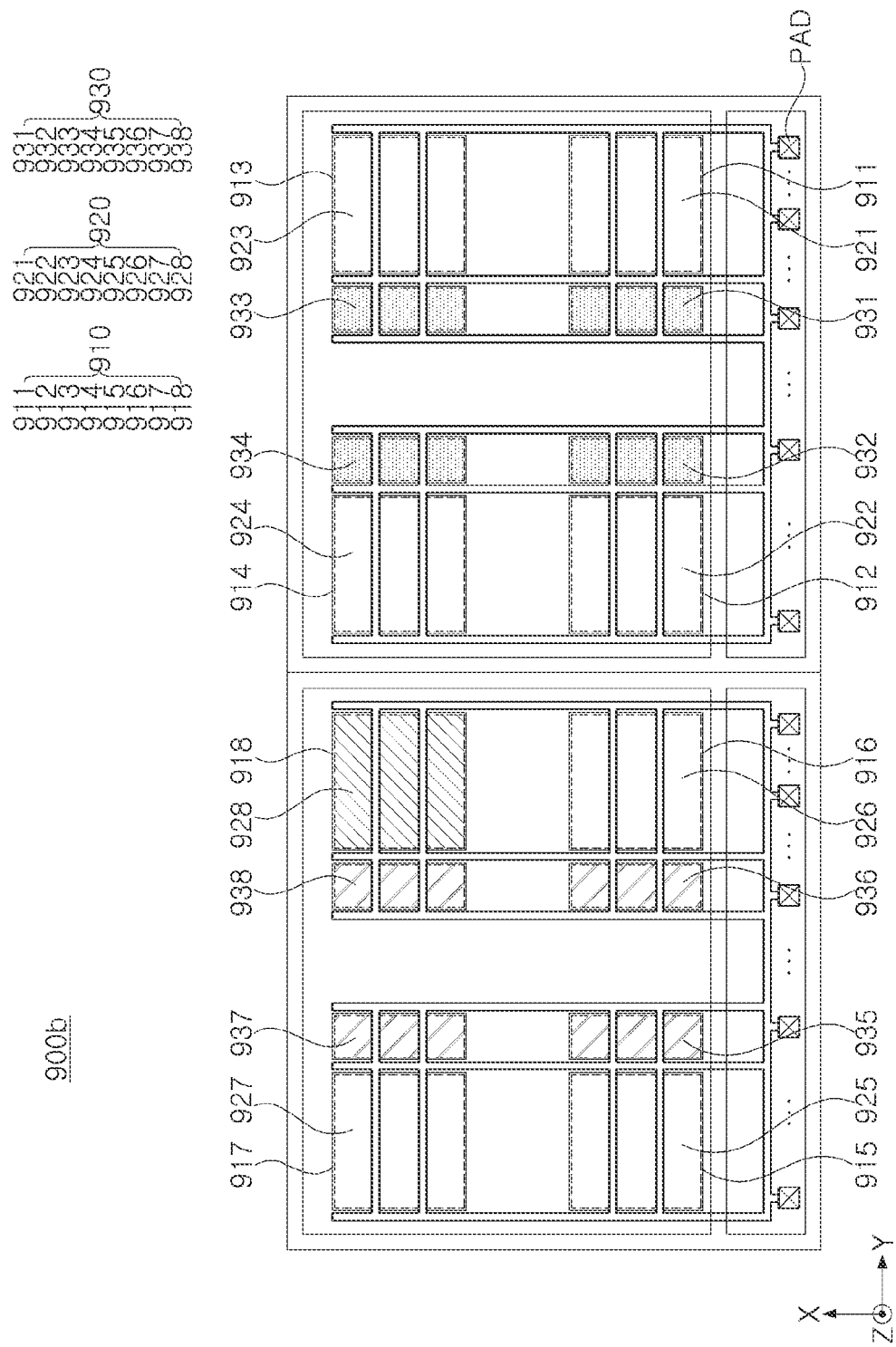

FIGS. 23 and 24 may be views illustrating input/output memory region and a selected memory region in an eighth sub-period in memory devices 900a and 900b according to an exemplary embodiment of the present inventive concept. A memory device 900a or 900b according to an embodiment of the present inventive concept includes a memory cell array including a plurality of memory regions 911, 912, . . . , and 918 (i.e., 910) having a plurality of memory cells 921, 922, . . . , and 928 (i.e., 920) and a plurality of peripheral circuits 931, 932, . . . , and 938 (i.e., 930) corresponding thereto. For example, FIG. 23 may illustrate a memory device 900a under a first condition, and FIG. 24 may illustrate a memory device 900b under a second condition. For example, input/output memory region in which input/output of data is performed in the eighth sub-period may be an eighth memory region 918. At least one of a plurality of eighth analog circuits 938 included in the eighth memory region 918 that may be input/output memory region in the eighth sub-period may be turned on. Also, in a similar manner to the operation in the fourth sub-period, at least one of a plurality of sixth analog circuits 936 included in a sixth memory region 916 disposed between the eighth memory region 918 and a pad region PAD may be further turned on. Likewise, at least one of a plurality of seventh analog circuits 937 and at least one of a plurality of fifth analog circuits 935 may be further turned on.

Figure 25:
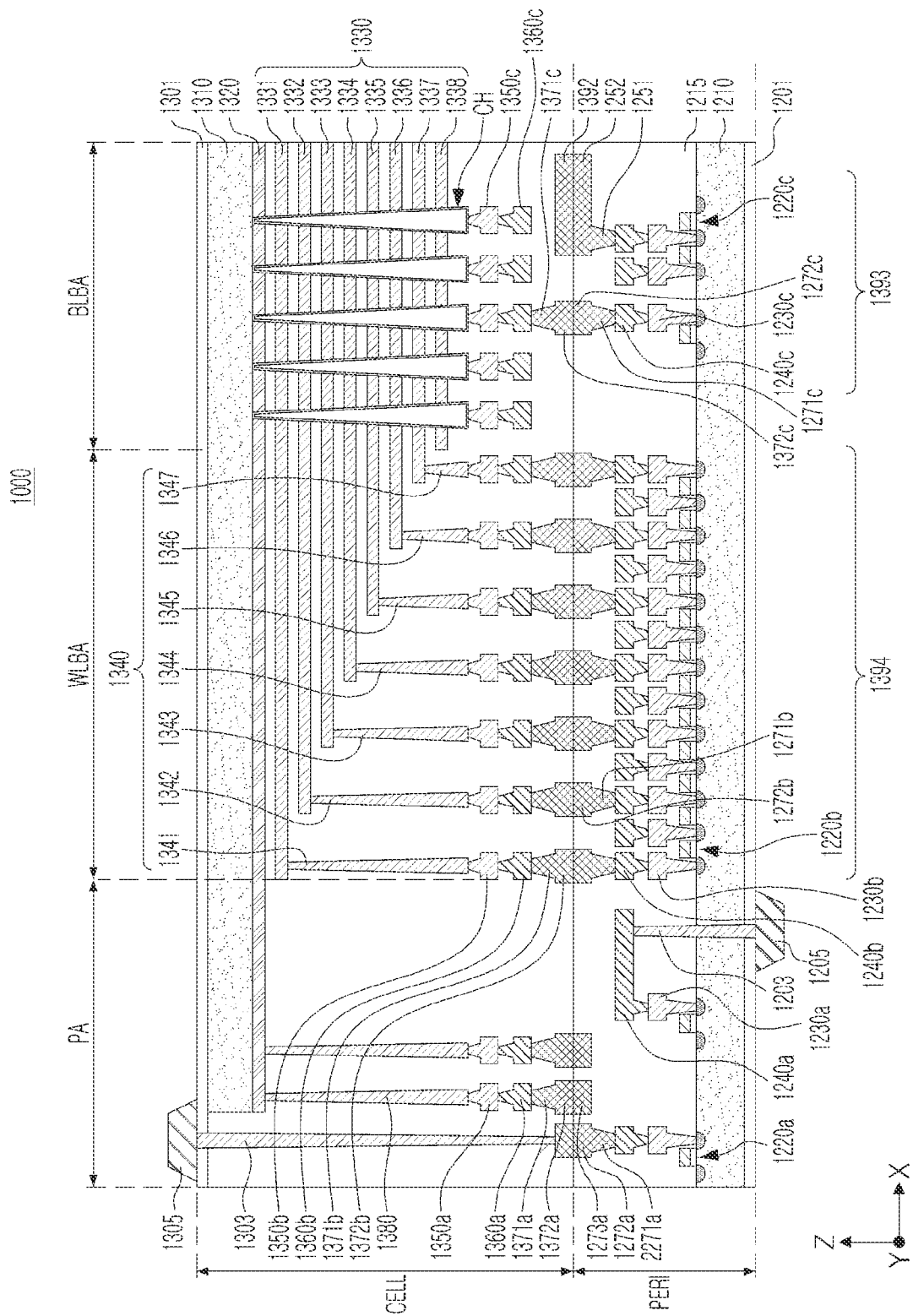
FIG. 25 is a view illustrating a BVNAND structure applicable to a memory device according to an exemplary embodiment of the present inventive concept.

FIG. 25 is a view illustrating a BVNAND structure applicable to a memory device according to an exemplary embodiment of the present inventive concept.

Referring to FIG. 25, a memory device 1000 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, different from the first wafer, and then bonding the upper chip and the lower chip to each other. In this case, the bonding process may include a method of electrically connecting a bonding metal formed on an uppermost metal layer of the upper chip, and a bonding metal formed on an uppermost metal layer of the lower chip. For example, when the bonding metals include copper (Cu) using a Cu-to-Cu bonding. The embodiment, however, is not limited thereto. For example, the bonding metals may also be formed of aluminum (Al) or tungsten (W).

Each of the peripheral circuit region PERI and the cell region CELL of the memory device 1000 may include an external pad bonding area PA, a word line bonding area WLBA, and a bit line bonding area BLBA.

The peripheral circuit region PERI may include a first substrate 1210, an interlayer insulating layer 1215, a plurality of circuit elements 1220a, 1220b, and 1220c formed on the first substrate 1210, first metal layers 1230a, 1230b, and 1230c respectively connected to the plurality of circuit elements 1220a, 1220b, and 1220c, and second metal layers 1240a, 1240b, and 1240c formed on the first metal layers 1230a, 1230b, and 1230c. In an embodiment, the first metal layers 1230a, 1230b, and 1230c may be formed of tungsten having relatively high electrical resistivity, and the second metal layers 1240a, 1240b, and 1240c may be formed of copper having relatively low electrical resistivity.

In the specification, although only the first metal layers 1230a, 1230b, and 1230c and the second metal layers 1240a, 1240b, and 1240c are illustrated and described, the embodiment is not limited thereto, and one or more additional metal layers may be further formed on the second metal layers 1240a, 1240b, and 1240c. At least a portion of the one or more additional metal layers formed on the second metal layers 1240a, 1240b, and 1240c may be formed of aluminum or the like having a lower electrical resistivity than those of copper forming the second metal layers 1240a, 1240b, and 1240c.

The interlayer insulating layer 1215 may be disposed on the first substrate 1210 and cover the plurality of circuit elements 1220a, 1220b, and 1220c, the first metal layers 1230a, 1230b, and 1230c, and the second metal layers 1240a, 1240b, and 1240c. The interlayer insulating layer 1215 may include an insulating material such as silicon oxide, silicon nitride, or the like.

Lower bonding metals 1271b and 1272b may be formed on the second metal layer 1240b in the word line bonding area WLBA. In the word line bonding area WLBA, the lower bonding metals 1271b and 1272b in the peripheral circuit region PERI may be electrically bonded to upper bonding metals 1371b and 1372b of the cell region CELL. The lower bonding metals 1271b and 1272b and the upper bonding metals 1371b and 1372b may be formed of aluminum, copper, tungsten, or the like.

The cell region CELL may include at least one memory block. The cell region CELL may include a second substrate 1310 and a common source line 1320. On the second substrate 1310, a plurality of word lines 1331 to 1338 (i.e., 1330) may be stacked in a direction (a Z-axis direction), perpendicular to an upper surface of the second substrate 1310. At least one string select line and at least one ground select line may be arranged on and below the plurality of word lines 1330, respectively, and the plurality of word lines 1330 may be disposed between the at least one string select line and the at least one ground select line.

In the bit line bonding area BLBA, a channel structure CH may extend in a direction (a Z-axis direction), perpendicular to the upper surface of the second substrate 1310, and pass through the plurality of word lines 1330, the at least one string select line, and the at least one ground select line. The channel structure CH may include a data storage layer, a channel layer, a buried insulating layer, and the like, and the channel layer may be electrically connected to a first metal layer 1350c and a second metal layer 1360c. For example, the first metal layer 1350c may be a bit line contact, and the second metal layer 1360c may be a bit line. In an embodiment, the bit line 1360c may extend in the first direction (a Y-axis direction), parallel to the upper surface of the second substrate 1310.

In an embodiment illustrated in FIG. 25, an area in which the channel structure CH and the bit line 1360c are disposed may be defined as the bit line bonding area BLBA. In the bit line bonding area BLBA, the bit line 1360c may be electrically connected to the circuit elements 1320c providing a page buffer 1393 in the peripheral circuit region PERI. The bit line 1360c may be connected to upper bonding metals 1371c and 1372c in the cell region CELL, and the upper bonding metals 1371c and 1372c may be connected to lower bonding metals 1271c and 1272c connected to the circuit elements 1320c of the page buffer 1393.

In the word line bonding area WLBA, the word lines 1330 may extend in a second direction (an X-axis direction), parallel to the upper surface of the second substrate 1310 and perpendicular to the first direction, and may be connected to a plurality of cell contact plugs 1341 to 1347 (i.e., 1340). The plurality of word lines 1330 and the plurality of cell contact plugs 1340 may be connected to each other in pads provided by at least a portion of the plurality of word lines 1330 extending in different lengths in the second direction. A first metal layer 1350b and a second metal layer 1360b may be connected to an upper portion of the plurality of cell contact plugs 1340 connected to the plurality of word lines 1330, sequentially. The plurality of cell contact plugs 1340 may be connected to the peripheral circuit region PERI by the upper bonding metals 1371b and 1372b of the cell region CELL and the lower bonding metals 1271b and 1272b of the peripheral circuit region PERI in the word line bonding area WLBA.

The plurality of cell contact plugs 1340 may be electrically connected to the circuit elements 1320b forming a row decoder 1394 in the peripheral circuit region PERI. In an embodiment, operating voltages of the circuit elements 1320b of the row decoder 1394 may be different than operating voltages of the circuit elements 1320c forming the page buffer 1393. For example, operating voltages of the circuit elements 1320c forming the page buffer 1393 may be greater than operating voltages of the circuit elements 1320b forming the row decoder 1394.

In a memory device 1000 according to an embodiment of the present inventive concept, cell contact plugs (not illustrated) may be electrically connected to circuit elements forming a plurality of analog circuits including an IVC driver in a peripheral circuit region PERI. As described above, the circuit elements forming a plurality of analog circuits may respectively correspond to a cell region CELL disposed thereon. An external power supply voltage applied through input/output pads 1205 and 1305 may be converted into an internal operating voltage by the plurality of analog circuits. The internal operating voltage may vary according to operation of the memory device 1000, and a control logic circuit formed from the circuit elements included in the peripheral circuit region PERI may operate a memory device 1000 according to an embodiment of the present inventive concept, by the internal operating voltage.

A common source line contact plug 1380 may be disposed in the external pad bonding area PA. The common source line contact plug 1380 may be formed of a conductive material such as a metal, a metal compound, polysilicon, or the like, and may be electrically connected to the common source line 1320. A first metal layer 1350a and a second metal layer 1360a may be stacked on an upper portion of the common source line contact plug 1380, sequentially. For example, an area in which the common source line contact plug 1380, the first metal layer 1350a, and the second metal layer 1360a are disposed may be defined as the external pad bonding area PA.

The input/output pads 1205 and 1305 may be disposed in the external pad bonding area PA. Referring to FIG. 25, a lower insulating film 1201 covering a lower surface of the first substrate 1210 may be formed below the first substrate 1210, and a first input/output pad 1205 may be formed on the lower insulating film 1201. The first input/output pad 1205 may be connected to at least one of the plurality of circuit elements 1220a, 1220b, and 1220c disposed in the peripheral circuit region PERI through a first input/output contact plug 1203, and may be separated from the first substrate 1210 by the lower insulating film 1201. In addition, a side insulating film may be disposed between the first input/output contact plug 1203 and the first substrate 1210 to electrically separate the first input/output contact plug 1203 and the first substrate 1210.

Referring to FIG. 25, an upper insulating film 1301 covering the upper surface of the second substrate 1310 may be formed on the second substrate 1310, and a second input/output pad 1305 may be disposed on the upper insulating layer 1301. The second input/output pad 1305 may be connected to at least one of the plurality of circuit elements 1220a, 1220b, and 1220c disposed in the peripheral circuit region PERI through a second input/output contact plug 1303. In an embodiment, the second input/output pad 1305 may be electrically connected to the circuit element 1220a.

According to embodiments, the second substrate 1310 and the common source line 1320 are disposed in an area in which the second input/output contact plug 1303 is disposed. Also, in an embodiment, the second input/output pad 1305 does not overlap the word lines 1330 in the third direction (the Z-axis direction). Referring to FIG. 25, the second input/output contact plug 303 may be separated from the second substrate 1310 in a direction, parallel to the upper surface of the second substrate 1310, and may pass through the interlayer insulating layer 1315 of the cell region CELL to be connected to the second input/output pad 1305.

According to embodiments, the first input/output pad 1205 and the second input/output pad 1305 may be selectively formed. For example, the memory device 1000 may include only the first input/output pad 1205 disposed on the first substrate 1310 or the second input/output pad 1305 disposed on the second substrate 1310. Alternatively, the memory device 1000 may include both the first input/output pad 1205 and the second input/output pad 1305.

A metal pattern provided on an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 1000 may include a lower metal pattern 1273a, corresponding to an upper metal pattern 1372a formed in an uppermost metal layer of the cell region CELL, and having the same cross-sectional shape as the upper metal pattern 1372a of the cell region CELL so as to be connected to each other, in an uppermost metal layer of the peripheral circuit region PERI. In the peripheral circuit region PERI, the lower metal pattern 1273a formed in the uppermost metal layer of the peripheral circuit region PERI may not be connected to a contact. Similarly, in the external pad bonding area PA, an upper metal pattern 1372a, corresponding to the lower metal pattern 1273a formed in an uppermost metal layer of the peripheral circuit region PERI, and having the same shape as the lower metal pattern 1273a of the peripheral circuit region PERI, may be formed in an uppermost metal layer of the cell region CELL.

The lower bonding metals 1271b and 1272b may be formed on the second metal layer 1340b in the word line bonding area WLBA. In the word line bonding area WLBA, the lower bonding metals 1271b and 1272b of the peripheral circuit region PERI may be electrically connected to the upper bonding metals 1371b and 1372b of the cell region CELL by a bonding.

Further, in the bit line bonding area BLBA, an upper metal pattern 1392, corresponding to a lower metal pattern 1252 formed in the uppermost metal layer of the peripheral circuit region PERI, and having the same cross-sectional shape as the lower metal pattern 1252 of the peripheral circuit region PERI, may be formed in an uppermost metal layer of the cell region CELL. A contact may not be formed on the upper metal pattern 1392 formed in the uppermost metal layer of the cell region CELL.

A memory device according to an exemplary embodiment of the present inventive concept selectively turns on only an IVC driver corresponding to a MAT selected according to a count output from an address decoder for a plurality of MATs to which data are sequentially input/output. Therefore, an amount of current consumed to form an internal operating voltage for input/output of data may be reduced.

While embodiments have been illustrated and described above, it will be apparent to those skilled in the art that modifications and variations could be made without departing from the scope of the present inventive concept.

What is claimed is:

1. A non-volatile memory device comprising:
   a first memory region including a plurality of first memory cells and a plurality of first analog circuits;
   a second memory region including a plurality of second memory cells and a plurality of second analog circuits;
   a control logic circuit determining whether to turn on or off the plurality of first analog circuits and the plurality of second analog circuits, based on an external signal applied from an external memory controller, and converting an external power supply voltage into an internal operating voltage for operation of each of the plurality of first memory cells and the plurality of second memory cells according to whether each of the plurality of first analog circuits and the plurality of second analog circuits are turned on or off; and
   an input/output circuit selecting an input/output memory region for performing input/output of data using the internal operating voltage,
   wherein input/output of data for the plurality of first memory cells and input/output of data for the plurality of second memory cells are sequentially performed, and at least one of the plurality of second analog circuits is turned on together with at least one of the plurality of first analog circuits while the input/output of data for the plurality of first memory cells is performed.

2. The non-volatile memory device of claim 1, wherein a period of the input/output of data for the plurality of first memory cells and the plurality of second memory cells include a first period in which a data input/output signal is activated, and a second period, after the first period, in which the data input/output signal is deactivated, and
   in the first period and the second period, a chip enable signal received from the external memory controller is in an enable state.

3. The non-volatile memory device of claim 1, further comprising:
   a third memory region including a plurality of third memory cells and a plurality of third analog circuits; and
   a fourth memory region including a plurality of fourth memory cells and a plurality of fourth analog circuits,
   wherein an input/output operation of data for the plurality of first to fourth memory cells respectively included in the first to fourth memory regions includes a first period in which the data is sequentially input/output, and a second period after the first period,
   wherein the first period includes a plurality of sub-periods respectively corresponding to the first to fourth memory regions.

4. The non-volatile memory device of claim 3, wherein, in the plurality of sub-periods, at least one of a plurality of input/output analog circuits included in input/output memory region respectively corresponding to the plurality of sub-periods is turned on,
   input/output of data for a plurality of input/output memory cells included in the input/output memory region is performed.

5. The non-volatile memory device of claim 4, wherein a number of input/output analog circuits turned on, among the plurality of input/output analog circuits, is determined based on an operation of the input/output memory region.

6. The non-volatile memory device of claim 3, wherein, in a first sub-period corresponding to the first memory region, at least one of the plurality of third analog circuits is further turned on, together with at least one of each of the plurality of first analog circuits and the plurality of second analog circuits.

7. The non-volatile memory device of claim 3, wherein, in a second sub-period corresponding to the second memory region, at least one of the plurality of first analog circuits is further turned on, together with at least one of each of the plurality of second analog circuits and the plurality of third analog circuits.

8. The non-volatile memory device of claim 3, wherein, in a third sub-period corresponding to the third memory region, at least one of the plurality of first analog circuits is further turned on, together with at least one of each of the plurality of third analog circuits and the plurality of fourth analog circuits.

9. The non-volatile memory device of claim 8, wherein, in the third sub-period, at least one of the plurality of second analog circuits is further turned on.

10. The non-volatile memory device of claim 3, wherein, in a fourth sub-period corresponding to the fourth memory region, at least one of the plurality of second analog circuits included in the second memory region is further turned on, together with at least one of the plurality of fourth analog circuits.

11. The non-volatile memory device of claim 10, wherein, in the fourth sub-period, at least one of each of the plurality of first analog circuits and the plurality of third analog circuits is further turned on.

12. The non-volatile memory device of claim 10, further comprising a plurality of memory cells to which data is input/output after input/output of data for the plurality of fourth memory cells, and a plurality of analog circuits corresponding to the plurality of memory cells,
    wherein, in the fourth sub-period, at least one of the plurality of analog circuits is further turned on.

13. A non-volatile memory device comprising:
    a semiconductor substrate;
    a first memory region disposed on the semiconductor substrate in a first direction, perpendicular to an upper surface of the semiconductor substrate;
    a second memory region disposed to be adjacent to the first memory region in a second direction, parallel to the upper surface of the semiconductor substrate;
    a third memory region disposed to be adjacent to the first memory region in a third direction, parallel to the upper surface of the semiconductor substrate and perpendicular to the second direction;

a fourth memory region disposed to be adjacent to the second memory region in the third direction and adjacent to the third memory region in the second direction; and a pad region disposed on lateral surfaces of the first and second memory regions and for transferring an external power supply voltage applied through a power pad, to a plurality of analog circuits for converting the external power supply voltage to an internal operating voltage, wherein the plurality of analog circuits are selectively turned on according to a memory region in which input/output of data is performed, and when the plurality of analog circuits included in the third memory region or the fourth memory region are turned on, the plurality of analog circuits included in at least one of the first memory region or the second memory region are turned on together.

14. The non-volatile memory device of claim 13, wherein the plurality of analog circuits are disposed in a space in which the first and second memory regions are adjacent to each other, and a space in which the third and fourth memory regions are adjacent to each other.

15. The non-volatile memory device of claim 13, further comprising fifth to eighth memory regions disposed to be adjacent to and have a mirror shape to the first to fourth memory regions in the second direction, wherein an input/output operation of data for a plurality of memory cells respectively included in the first to eighth memory regions includes a first period in which the data is sequentially input/output, and a second period after the first period.

16. The non-volatile memory device of claim 15, wherein a number of memory regions including the plurality of analog circuits turned on in the first period ranges from 2 to 6.

17. The non-volatile memory device of claim 15, wherein a number of memory regions including the plurality of analog circuits turned on in the second period ranges from 2 to 4.

18. A non-volatile memory device comprising:
a memory cell array including a plurality of memory regions respectively having a plurality of memory cells;
a plurality of analog circuits respectively disposed to be adjacent to the plurality of memory regions, and converting an external power supply voltage into an internal operating voltage;
an address decoder outputting an address for determining an input/output memory region including a plurality of input/output memory cells in which data is input/output, among the plurality of memory cells;
a control logic circuit selecting only a portion of the plurality of memory regions, as a selected memory region, based on the address, and selectively turning on at least one of the plurality of analog circuits corresponding to the selected memory region,
wherein the selected memory region includes the input/output memory region, and a preliminary input/output memory region in which input/output of data is performed after data for the input/output memory region is input/output.

19. The non-volatile memory device of claim 18, wherein the control logic circuit selects a portion of the plurality of memory regions according to one of a first condition and a second condition different from the first condition, and turns on an analog circuit corresponding to the selected memory region.

20. The non-volatile memory device of claim 19, wherein, in all periods in which the input/output of data is performed, a number of memory regions selected according to the first condition is equal to or less than a number of memory regions selected according to the second condition.

* * * * *